United States Patent
Okada et al.

(10) Patent No.: US 6,998,712 B2
(45) Date of Patent: Feb. 14, 2006

(54) SEMICONDUCTOR DEVICE AND METHOD FOR MANUFACTURING THE SAME

(75) Inventors: Norio Okada, Kanagawa (JP); Hirokazu Aizawa, Kanagawa (JP); Hiroyasu Minda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/649,771

(22) Filed: Aug. 28, 2003

(65) Prior Publication Data

US 2004/0150070 A1    Aug. 5, 2004

(30) Foreign Application Priority Data

Feb. 3, 2003  (JP) .............................. 2003-026526
Apr. 17, 2003  (JP) .............................. 2003-113412

(51) Int. Cl.
*H01L 23/053* (2006.01)
(52) U.S. Cl. ...................... 257/758; 257/774
(58) Field of Classification Search ........ 438/618–687; 257/750–776
See application file for complete search history.

(56) References Cited

U.S. PATENT DOCUMENTS

2002/0024115 A1 * 2/2002 Ibnabdeljalil et al. ....... 257/620
2002/0125577 A1 * 9/2002 Komada ..................... 257/774

FOREIGN PATENT DOCUMENTS

JP        2000-232104        8/2000

* cited by examiner

*Primary Examiner*—H. Jey Tsai
(74) *Attorney, Agent, or Firm*—McGinn IP Law Group, PLLC

(57) ABSTRACT

In a provided semiconductor device, a plurality of seal rings each made of a conductive material is formed along a periphery of the semiconductor chip and as to surround the circuit formation portion, the seal rings being connected with the semiconductor substrate and being buried in the plurality of wiring insulating films in such a manner as to extend over the wiring insulating films, and one or more slit-like notches are formed at specified positions in the plurality of seal rings in such a manner that the respective slit-like notches in two seal rings being adjacent to each other are not aligned.

13 Claims, 16 Drawing Sheets

- 10; semiconductor chip
- 21; first seal ring
- 22; second seal ring
- 23; third seal ring
- 20

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same and, more particularly, to the semiconductor device and the method for manufacturing the same, in which the semiconductor device is provided with a seal ring for preventing water, moisture, and a like from penetrating into it through a dicing face of each of semiconductor dices separated from a semiconductor substrate by dicing.

The present application claims two priorities of Japanese Patent Application No.2003-026526 filed on Feb. 3, 2003 and Japanese Patent Application No.2003-113412 filed on Apr. 17, 2003, which are hereby incorporated by reference.

2. Description of the Related Art

A Large Scale Integration (LSI) such as a microprocessor or a memory known as a representative of semiconductor devices has become finer in size of each of its elements as higher levels of integration are achieved, so that correspondingly a size of a semiconductor region making up each of the elements has also become finer. Further, when forming a wiring line to be connected to each of the semiconductor regions, in order to reserve a high wiring density corresponding to a high integration density, it is not enough to form the wiring line only in a plane direction of a semiconductor substrate, so that multi-layer wiring technologies have been employed, by which the wiring lines are formed on a plurality of layers in a thickness direction of the semiconductor substrate. A multi-layer wiring structure including six to nine layers is realized in an example of a microprocessor, which is a representative of the LSIs.

In such the LSI that a multi-layer wiring structure is employed, a resistance value of the wiring lines has a large influence on characteristics such as an operating speed, so that the wiring line is desired to have a smaller resistance value. Conventionally, as a material of the wiring lines of semiconductor devices including LSIs, aluminum (Al) excellent in electrical characteristics, processability, and a like, or aluminum-based metal has been used generally. However, aluminum and aluminum-based metal (hereinafter may be referred simply to as aluminum-based metal) have a drawback of being low in electro-migration resistance, stress-migration resistance, and alike. Therefore, there is a recent tendency to replace aluminum-based metal with copper (Cu) or copper-based metal (hereinafter may be referred simply to as copper-based metal) that has a smaller resistance value and is excellent in electro-migration resistance, stress-migration resistance, or a like.

However, when forming the wiring lines using copper-based metal, a copper-based compound, which has a low vapor pressure, is difficult to pattern into a desired shape utilizing dry etching technologies as compared to aluminum-based metal. Therefore, to form the wiring line using copper-based metal, a known single damascene wiring technology is employed, by which after forming beforehand a wiring trench in a wiring insulating film formed on the semiconductor substrate and the copper-based metal film throughout a surface including this wiring trench, an unnecessary portion of the copper-based metal on the wiring insulating film is removed by Chemical Mechanical Polishing (CMP) so as to provide as the wiring line a portion of the copper-based metal film left (buried) only in the wiring trench. Further, a dual damascene wiring technology, which is an extension of the single damascene wiring technology, is employed, by which a structure suited for fine-patterned multi-layer wiring is realized.

In the dual-damascene wiring structure, on the semiconductor substrate on which a lower-layer wiring line is formed beforehand, an via insulating film (so-called an inter-layer dielectric) and a wiring insulating film are stacked, then a via hole and an upper-layer wiring trench are formed through these wiring insulating films respectively, then a copper-based metal film is formed throughout a surface, and then an unnecessary portion of the copper-based metal film is removed by CMP or a like so as to leave the copper-based metal film only in the via hole and the upper-layer wiring trench, thereby forming a via plug and an upper-layer wiring simultaneously. By such a configuration, the dual damascene wiring structure can be realized, in which the lower-layer and the upper-layer wiring are interconnected through the via plug.

Further, in the semiconductor device having the multi-layer wiring structure, a high-speed operation is affected by a signal delay due to, for example, an increase in inter-wiring line capacitance (hereinafter referred to also as capacitance simply) given by an wiring insulating film present between a lower-layer wiring line and an upper-layer wiring line or an increase in inter-wiring line capacitance caused by a decrease in plane directional inter-wiring-line interval caused by an improvement in fine patterning. Therefore, there is a tendency to use a low-dielectric constant film ("so-called" low-κ insulation film) as the wiring insulating film in order to reduce the capacitance due to the wiring insulating film.

In manufacture of the LSI, after necessary circuit elements are integrated on the semiconductor substrate in a condition where it is a wafer, the semiconductor substrate is separated into individual semiconductor dice by dicing. However, in this case, a dicing face of the semiconductor chip, that is, a sidewall of an wiring insulating film is exposed, so that water, moisture, and a like (hereinafter referred to as "water and a like") penetrates through the dicing face, thus deteriorating moisture resistance. Especially, the LSI employing such a multi-layer wiring structure as described above has a larger number of wiring insulating film layers and so tends more to suffer from such deterioration in moisture resistance. It, therefore, may lead to a drawback such as an increase in leakage current or in dielectric constant of an originally low-dielectric constant film. To solve the drawback, it is desired to improve the moisture resistance.

Further, in manufacture of the LSI, when integrating necessary circuit elements on the semiconductor substrate in a condition where it is a wafer, various kinds of pads such as an assembly pad including a bonding pad for electrically interconnecting the circuit elements and an outside of the LSI, an intra-LSI characteristics evaluation pad, or a screening evaluation pad are provided on a surface of the semiconductor substrate. Then, for example, a wire is bonded to the assembly pad at the time of assembly of the LSI, while a test probe of an electrical measuring device is brought in contact with the characteristics evaluation pad or the screening evaluation pad at the time of, for example, product-shipment screening. To each of such pads formed on the surface of the semiconductor substrate beforehand, a load due to wire bonding or due to contact with the test probe is applied, so that a crack, a so-called pad crack, is likely to occur at such a portion of the semiconductor chip including an wiring insulating film directly below each of the pads. As a result, as described above, water and a like, if having penetrated through the dicing face, may get into the die through the pad crack, thus deteriorating moisture resistance. Therefore, it is necessary to take measures against pad cracks.

An LSI semiconductor device arranged to improve moisture resistance by preventing water and a like from penetrating through a dicing face as described above is disclosed in Japanese Patent Application Laid-open No. 2000-232104 (See pp. 3–5, FIG. 1.). As shown in FIG. 26, in the semiconductor device, between a circuit formation portion 102 and a dicing line portion 103 of a semiconductor chip 101, a seal ring 104 is provided in such a manner as to surround the circuit formation portion 102. In configuration, the seal ring 104 is formed by sequentially stacking: a tungsten plug 108 provided in each of three first seal trenches 106 formed in a first wiring insulating film 105 via the respective barrier metal layers 107; a first-layer metal electrode 109 that covers the tungsten plugs 108 entirely; a second tungsten plug 113 provided in each of two second seal trenches 111 formed in a second wiring insulating film 110 via respective barrier metal layers 112, to cover the first-layer metal electrode 109; and a second-layer metal electrode 114 that covers the second tungsten plugs 113 entirely.

In this configuration, even when semiconductor dice are separated from each other at the dicing line portion 103 by dicing to then expose a sidewall of each of wiring insulating films 105 and 110, water and a like penetrating into the semiconductor chip through its dicing face is blocked by the presence of the seal ring 104, thereby enabling improving moisture resistance.

The conventional semiconductor device as described in Japanese Patent Application No. 2000-232104 has a problem of insufficient moisture resistance at an interface between a wiring layer and an wiring insulating film that make up a seal ring 104, so that resultantly, even in such a configuration that a multi-tungsten plug structure is arranged as part of the seal ring 104, the LSI semiconductor device has a problem that its moisture resistance cannot sufficiently be improved.

That is, as shown in FIG. 26, the seal ring 104 provided to the LSI semiconductor device disclosed in the above patent document includes: the tungsten plugs 108 and 113 that are formed in such a manner as to surround the circuit formation portion 102 multiply; and the first-layer and second-layer metal electrodes 109 and 114 that are formed as one region physically. The first-layer and second-layer metal electrodes 109 and 114 are both stacked together with the second wiring insulating film 110.

An interface between each of the first-layer and second-layer metal electrodes 109 and 114 and the wiring insulating film 110 is generally low in moisture resistance, so that if chipping occurs at the time of dicing, water and a like penetrating through a dicing face readily reaches the first-layer and second-layer metal electrodes 109 and 114. As a result, the first-layer or second-layer metal electrode 109 or 114 starts deteriorating, so that the water and a like progressively penetrates further deeply beyond the first-layer or second-layer metal electrode 109 or 114. If the water and a like penetrates into the circuit formation portion 102, for example, a leakage current or a dielectric constant of the originally low-dielectric constant film increases, thus deteriorating reliabilities of the LSI semiconductor device. This tendency is especially remarkable at an upper part of the seal ring 104 because it has only the second-layer metal electrode 114 on it.

Further, the conventional semiconductor device described in the above patent document has a problem that the seal ring 104, which is shaped endlessly, encounters an induction current flowing through it if a magnetic field occurs during a process of manufacturing the LSI semiconductor device.

That is, although a film formation technology such as Chemical Vapor Deposition (CVD) or sputtering that utilizes plasma and a process technology such as dry etching are widely implemented in the LSI semiconductor device manufacturing process, such a process technology as to utilize plasma involves occurrence of a magnetic field, so that as shown in FIG. 27 a magnetic field H that has occurred in such a manner interlinks with the seal ring 104, on which a current I is induced. The result will be described as follows with reference to an example where plasma etching is performed to form, for example, copper-made wiring line. As shown in FIG. 28, such a phenomenon is observed that a copper layer 115 breaks out around a via hole 116 owing to an influence of the induced current. Therefore, the copper wiring line becomes defective, thus deteriorating a manufacture yield.

Further, the conventional semiconductor device described in the above patent document takes into account countermeasures against penetration of water and a like through the dicing face but not at all those against such pad cracks as described above.

SUMMARY OF THE INVENTION

In view of the above, the present invention has been developed, and it is an object of the present invention to provide a semiconductor device and a method for manufacturing the same for enabling improving moisture resistance sufficiently in a configuration in which the device is provided with a seal ring that surrounds a circuit formation portion.

According to a first aspect of the present invention, there is provided a semiconductor device having:

a semiconductor chip provided with a circuit formation portion including a plurality of wiring insulating films stacked on top of each other in layers on a semiconductor substrate, and a multi-layer interconnection formed in the plurality of wiring insulating films, wherein one or more wiring trenches are formed in each of the plurality of wiring insulating films along a periphery of the semiconductor chip in such a manner as to surround the circuit formation portion, wherein in each of the one or more wiring trenches, a conductive layer made up of copper or a copper-based conductive material is buried via a first copper diffusion preventing film, in such a manner that the respective wiring trenches corresponding to each other in the plurality of wiring insulating films are connected with each other upwardly or downwardly, and wherein a second copper diffusion preventing film is formed between each of the plurality of wiring insulating films and an other one of the plurality of wiring insulating films being adjacent thereto upwardly or downwardly, in such a manner as to be connected with the corresponding first copper diffusion preventing film.

In the foregoing first aspect, a preferable mode is one wherein the at least one conductive layer is connected to a diffusion region formed in the semiconductor substrate.

Another preferable mode is one wherein at least one of the plurality of wiring insulating films includes a low-dielectric constant film.

According to a second aspect of the present invention, there is provided a semiconductor device having:

a semiconductor chip provided with a circuit formation portion including a plurality of wiring insulating films stacked on top of each other in layers on a semiconductor substrate, and a multi-layer interconnection formed in the plurality of wiring insulating films, wherein at least one seal ring made of a conductive material is formed along a periphery of the semiconductor chip so as to surround the circuit formation portion, the at least one seal ring being connected with the semiconductor substrate and being buried in the plurality of wiring insulating films in such a manner as to extend over the wiring insulating films.

According to a third aspect of the present invention, there is provided a semiconductor device having:

a semiconductor chip provided with a circuit formation portion including a plurality of wiring insulating films stacked on top of each other in layers on a semiconductor substrate, and a multi-layer interconnection formed in the plurality of wiring insulating films, wherein a plurality of seal rings each made of a conductive material is formed along a periphery of the semiconductor chip so as to surround the circuit formation portion, the seal ring beings connected with the semiconductor substrate and being buried in the plurality of wiring insulating films in such a manner as to extend over the wiring insulating films, and wherein one or more slit-like notches are formed at specified positions on the plurality of seal rings in such a manner that the respective slit-like notches in two seal rings being adjacent to each other are not aligned.

In the foregoing second and third aspects, a preferable mode is one wherein the at least one seal ring includes a damascene wiring structure as well as the multi-layer interconnection of the circuit formation portion.

Another preferable mode is one wherein a damascene wiring structure includes a single damascene wiring structure.

Still another preferable mode is one wherein the damascene wiring structure includes a dual damascene wiring structure.

An additional preferable mode is one wherein the damascene wiring structure includes a combination of a single damascene wiring structure and a dual damascene wiring structure.

a still additional preferable mode is one wherein the at least one seal ring is connected to a diffusion region formed in the semiconductor substrate.

a further preferable mode is one wherein the at least one seal ring is connected via a contact to a diffusion region formed in the semiconductor substrate, the contact and the diffusion region being formed so as to match approximately the at least one seal ring in shape.

Still further preferable mode is one wherein the at least one seal ring is connected via a contact to a diffusion region formed in the semiconductor substrate, the contact and the diffusion region being formed without matching the at least one seal ring.

Also, an additional preferable mode is one wherein the at least one seal ring includes copper or a copper-based conductive material.

Still additional a preferable mode is one wherein at least one of the plurality of wiring insulating films includes a low-dielectric constant film.

According to a fourth aspect of the present invention, there is provided a method for manufacturing a semiconductor device having a semiconductor chip that includes a semiconductor substrate on which a plurality of wiring insulating films is stacked and a circuit formation portion containing multi-layer wiring lines each of which is formed on each of the wiring insulating films is formed, including: the method including:

a first step for forming diffusion regions on the semiconductor substrate and then forming a first wiring insulating film on the semiconductor substrate to form such a plurality of first wiring layers through the first wiring insulating film as to surround the circuit formation portion and be connected with the diffusion regions respectively;

a second step for forming a second wiring insulating film on the first wiring layer and then forming such a plurality of via wiring layers through the second wiring insulating film as to surround the circuit formation portion and be connected with the first wiring layers respectively; and a third step for forming a third wiring insulating film on the via wiring layer and then forming such a plurality of second wiring layers through the third wiring insulating film as to surround the circuit formation portion and be connected with the via wiring layers respectively.

In the foregoing, a preferable mode is one wherein the second step and the third step are repeated alternately as occasion demands.

According to a fourth aspect of the present invention, there is provided a method for manufacturing a semiconductor device including:

a semiconductor chip provided with a circuit formation portion including a plurality of wiring insulating films stacked on top of each other in layers on a semiconductor substrate, and a multi-layer interconnection formed in the plurality of wiring insulating films, a first step for forming a diffusion region on the semiconductor substrate and then forming a first wiring insulating film on the semiconductor substrate to form a plurality of first wirings in the first wiring insulating film so as to surround the circuit formation portion and be connected respectively with the diffusion region;

a second step for forming a second wiring insulating film on the plurality of first wirings and the first wiring insulating film, and then forming a plurality of via wirings in the second wiring insulating film so as to surround the circuit formation portion and be connected respectively with the corresponding first wiring; and a third step for forming a third wiring insulating film on the via wirings and the second wiring insulating film, and then forming a plurality of second wirings in the third wiring insulating film so as to surround the circuit formation portion and be connected respectively with the corresponding via wiring. In the foregoing fourth aspect, a preferable mode is one wherein the second step and the third step are repeated alternately, hereby forming sequentially a third insulating film wherein a plurality of third wirings is buried, and a subsequent insulating film wherein a plurality of subsequent wirings is buried.

Another preferable mode is one that wherein, when forming the plurality of first wirings, the plurality of via wirings and the plurality of second wirings to form a plurality of seal rings, one or more slit-like notches are formed at specified positions on each of the plurality of seal rings.

According to a fifth aspect of the present invention, there is provided a method for manufacturing a semiconductor device including:

a semiconductor chip provided with a circuit formation portion including a plurality of wiring insulating films stacked on top of each other in layers on a semiconductor substrate, and a multi-layer interconnection formed in the plurality of wiring insulating films, a first step for forming a diffusion region on the semiconductor substrate and then forming a first wiring insulating film on the semiconductor substrate to form a plurality of first wirings in the first wiring insulating film so as to surround the circuit formation portion and be connected respectively with the diffusion region; and a second step for forming a second wiring insulating film on the plurality of first wirings and the first wiring insulating film and forming sequentially a third wiring insulating film on the second wiring insulating film, and then forming simultaneously a plurality of via wirings in the second wiring insulating film and a plurality of second wirings in the third wiring insulating film, so as to surround the circuit formation portion and be respectively connected with the corresponding first wiring.

Another preferable mode is one wherein the second step is repeated, hereby forming sequentially a third insulating film wherein a plurality of third wirings is buried, and a subsequent insulating film wherein a plurality of subsequent wirings is buried.

Still another preferable mode is one wherein the second step, after the second wiring insulating film and the third wiring insulating film are formed sequentially on the plurality of first wirings and the first wiring insulating film, includes a step of forming simultaneously a plurality of wiring trenches in the third wiring insulating film and a plurality of via wiring trenches in the second wiring insulating film, a plurality of wiring trenches each communicate with the corresponding via wiring trench.

A further preferable mode is one that wherein when forming the plurality of first wiring, the plurality of via wirings and the plurality of second wirings to form a plurality of seal rings, one or more slit-like notches are formed at specified positions on each of the plurality of seal rings.

According to a fifth aspect of the present invention, there is provided a semiconductor device including:

a semiconductor chip provided with a circuit formation portion including a plurality of wiring insulating films stacked on top of each other in layers on a semiconductor substrate, and a multi-layer interconnection formed in the plurality of wiring insulating films, wherein an assembly pad, a characteristics evaluation pad, or a screening evaluation pad each are formed on a surface of the semiconductor substrate in such a manner to be electrically connected to the circuit formation portion, and wherein at least one seal ring made of a conductive material is formed in such a manner as to surround the assembly pad, the characteristics evaluation pad, or the screening evaluation pad, the at least one seal ring being connected with the semiconductor substrate and extending over the wiring insulating films.

A preferable mode is one wherein, at least one bottomed seal ring, being not connected with the semiconductor substrate, is formed in such a manner as to surround the assembly pad, the characteristics evaluation pad, or the screening evaluation pad. Another preferable mode is one wherein the at least one seal ring includes a damascene wiring structure.

Still another preferable mode is one wherein the at least one bottomed seal ring includes a damascene wiring structure.

According to a sixth aspect of the present invention, there is provided a semiconductor device including:

a semiconductor chip provided with a circuit formation portion including a plurality of wiring insulating films stacked on top of each other in layers on a semiconductor substrate, and a multi-layer interconnection formed in the plurality of wiring insulating films, wherein a plurality of fuse elements for each replacing a defective circuit element therewith is provided on a surface of the semiconductor substrate in such a manner as to be electrically connected with the circuit formation portion, and wherein at least one seal ring each made of a conductive layer is formed in such a manner as to surround the plurality of fuse elements, the at least one seal ring being connected with the semiconductor substrate and extending over the wiring insulating films.

In the foregoing sixth aspect, a preferable mode is one wherein, at least one bottomed seal ring, being not connected with the semiconductor substrate, is formed in such a manner as to surround the plurality of fuse elements.

Another preferable mode is one wherein the at least one seal ring includes a damascene wiring structure.

Still another mode is one wherein the at least one bottomed seal ring includes a damascene wiring structure.

With configuration of the fifth aspect, in a configuration in which an assembly pad, a characteristics evaluation pad, or a screening evaluation pad is provided, a seal ring or a bottomed seal ring is provided in such a manner as to surround the pad, so that even upon occurrence of a pad crack, water and a like, if having penetrated through a dicing face, can be blocked from penetrating further deeply inward by the presence of the seal ring.

Also, with configuration of the sixth aspect, in a configuration in which a plurality of fuse elements is provided for replacement of a defective circuit element, a seal ring or a bottomed seal ring is provided in such a manner as to surround the plurality of fuse elements, so that even upon occurrence of a fuse element crack, water and a like, if having penetrated through a dicing face, can be blocked from penetrating further deeply inward by the presence of the seal ring.

BRIEF DESCRIPTION OF THE DRAWINGS

The above and other objects, advantages, and features of the present invention will be more apparent from the following description taken in conjunction with the accompanying drawings, in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
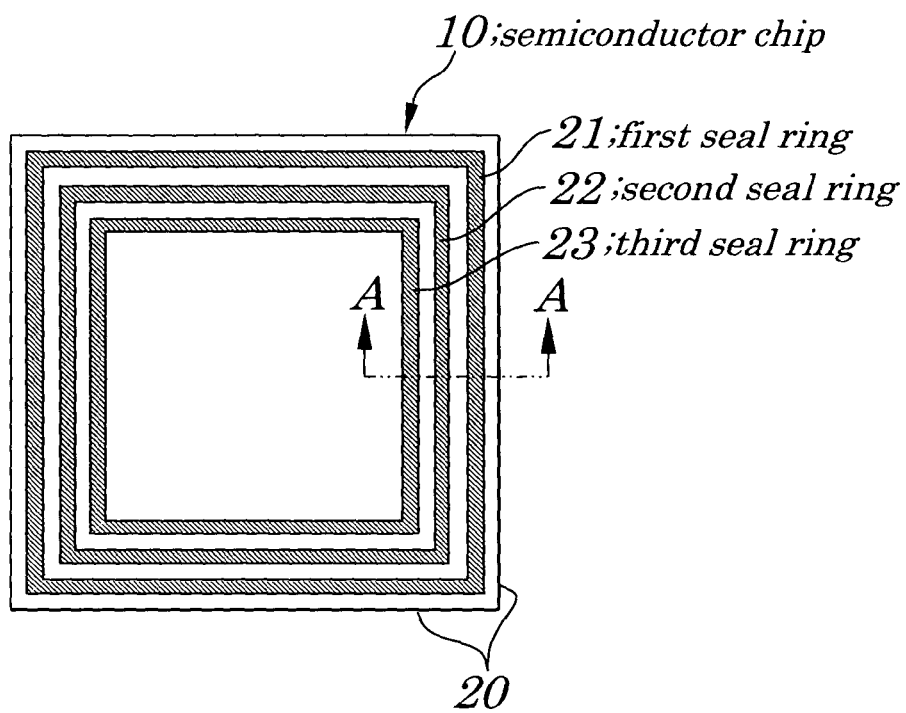
FIG. 1 is a plan view for showing a configuration of a semiconductor device according to a first embodiment of the present invention.
Figure 2:
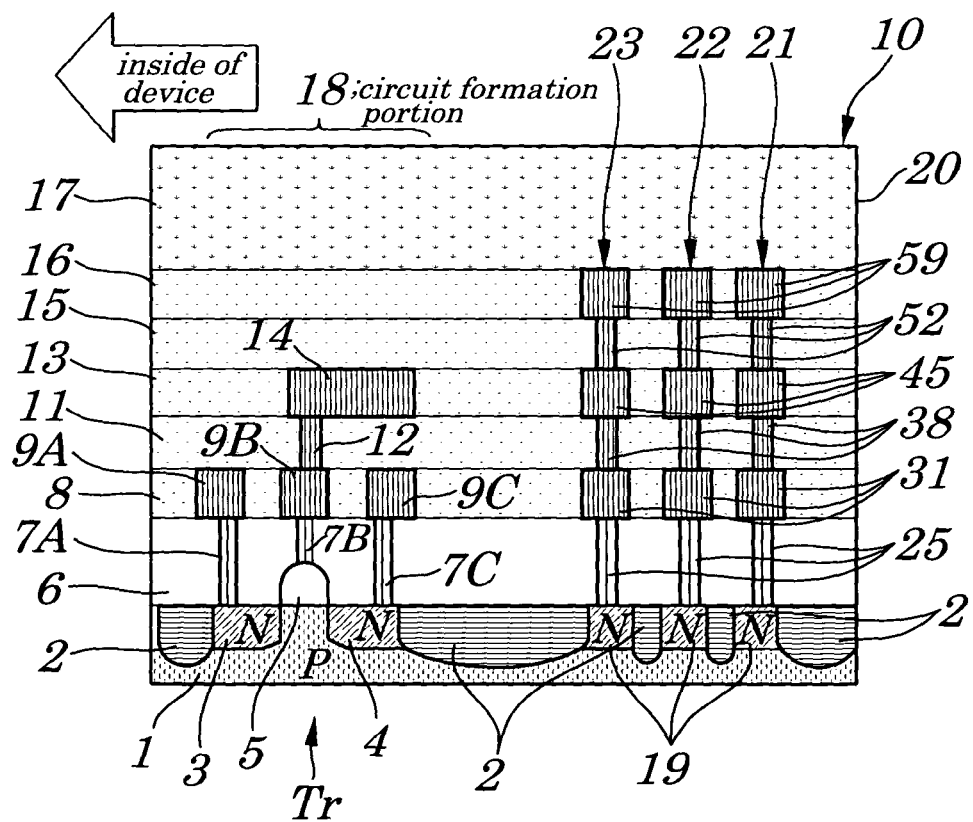
FIG. 2 is a cross-sectional view taken along line A—A of FIG. 1.

As shown in FIGS. 1 and 2, a semiconductor device of the present embodiment has a semiconductor chip 10 made up of a semiconductor substrate 1 being, for example, P-type silicon. In an active region surrounded by an element isolation region 2 formed in the substrate 1 by Shallow Trench Isolation (STI) and a like, a pair of N-type diffusion regions 3, 4 to serve as source and drain regions between which a gate portion 5 is formed. And contacts 7A through 7C are formed through a protective insulation film 6 so as to connect between each of the N-type diffusion regions 3 and 4 and the gate portion 5 and the corresponding wiring 9A to 9C. In this configuration, as known, the gate portion 5 to which the contact 7B is connected is composed of a gate insulation film made up of silicon oxide or a like and a gate electrode made up of a poly-silicon film or a like formed on this gate insulation film. Both the N-type diffusion regions 3 and 4 and the gate portion 5 make up an N-channel Metal Oxide Semiconductor (MOS) transistor Tr.

On a first wiring insulating film 8 formed on the protective insulation film 6, first wiring layers 9A through 9C made of copper are formed by a damascene wiring technology; in a second wiring insulating film (with a first via wiring layer 38 buried therein; so-called an inter-layer dielectric) 11 formed on the first wiring insulating film 8, a via wiring layer 12 made of copper is formed by the damascene wiring technology in such a manner as to be connected with the first wiring layer 9B; and in a third wiring insulating film 13 formed on the second wiring insulating film 11, a second wiring layer 14 made of copper is formed by the damascene wiring technology in such a manner as to be connected with the via wiring layer 12. Furthermore, on the third wiring insulating film 13, a fourth wiring insulating film (with a second via wiring layer 52 buried therein; so-called an inter-layer dielectric) 15 is formed, while on the fourth wiring insulating film 15, a passivation film 17 is formed via a fifth wiring insulating film 16, to protect a surface entirely. In such a configuration, a circuit formation portion 18 including multi-layer interconnection made up of the first wiring layers 9A through 9B and the second wiring layer 14 is provided on the semiconductor chip 10.

On the other hand, first through third seal rings 21 to 23 made up of conductive layers extended in a film-thickness direction of the first through fifth wiring insulating films 8, 11, 13, 15, and 16 so as to be electrically connected one after another to other N-type diffusion regions 19 surrounded by the element isolation region 2 are provided as insulated from each other endlessly and concentrically along a periphery of the semiconductor chip 10 in such a manner as to surround the circuit formation portion 18. The N-type diffusion regions 19 are formed at a same time in the same process as the one pair of N-type diffusion regions 3 and 4 are formed in the circuit formation portion 18. The first seal ring 21 is provided nearest a dicing face 20 of the semiconductor chip 10, followed by the second seal ring 22 and the third seal ring 23 in an order of separation from the dicing face 20.

Figure 3:
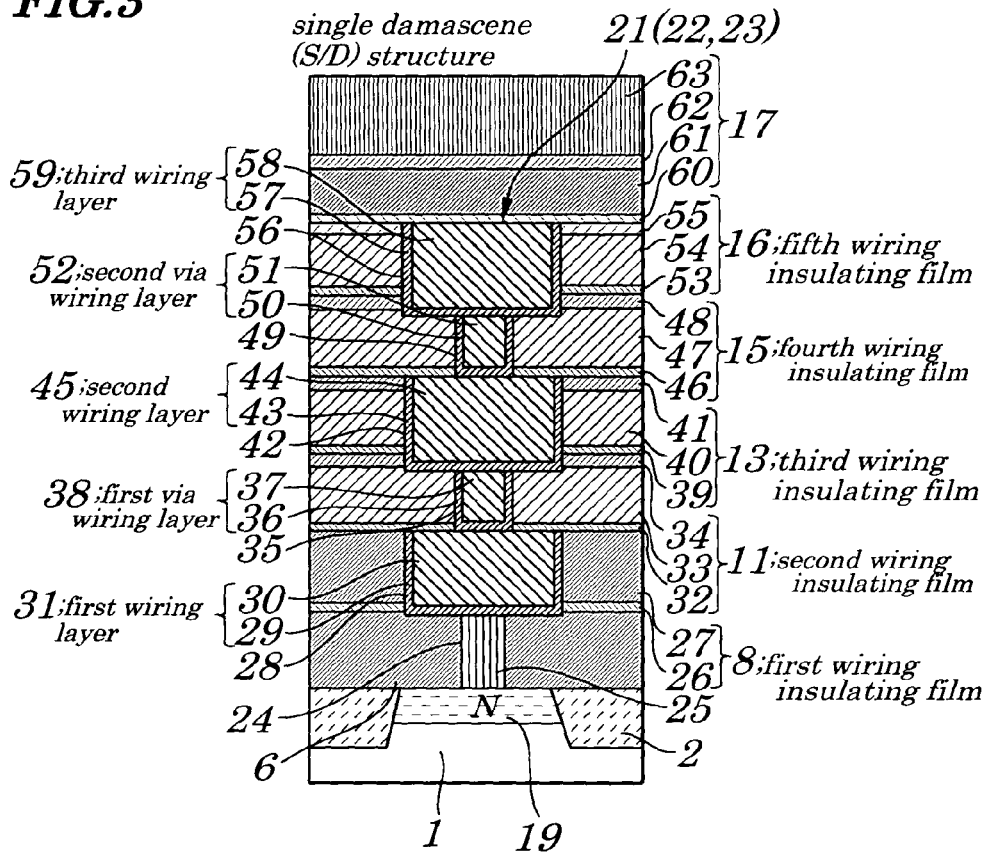
FIG. 3 is a cross-sectional view for showing a specific configuration of a seal ring of the semiconductor device manufactured utilizing a single damascene wiring technology according to the first embodiment of the present invention.

The first through third seal rings 21 to 23 each have a configuration given by using, for example, a single damascene wiring technology as shown in FIG. 3. It is to be noted that the configuration of only the first seal ring 21 is shown as one example in FIG. 3 and the second seal ring 22 and the third seal ring 23 have also the similar configuration.

In the protective insulation film 6 made of a silicon oxide film having a film thickness of 500 to 800 nm and covering the N-type diffusion regions 19 surrounded by the element isolation region 2, a contact hole 24 is formed by a known photolithographic technology. In the contact hole 24, a contact 25 is formed which includes a tungsten layer and a barrier metal layer (not shown) having configuration of stacked layers made up of a titanium (Ti) film having a film thickness of 5 to 15 nm and a titanium nitride film (TiN) having a film thickness of 10 to 20 nm. This contact 25 is formed simultaneously in the same process as that in which the contacts 7A to 7C are formed in such the circuit formation portion 18 as shown in FIG. 2. On the protective insulation film 6, the first wiring insulating film 8 is formed so as to have a configuration of stacked layers made up of a silicon nitride film 26 having a film thickness of 10 to 50 nm and a silicon oxide film 27 having a film thickness of 200 to 400 nm, in which the first wiring insulating film 8 a trench (wiring trench) 28 is formed. In the trench 28, a first wiring layer 31 is formed which includes a copper layer 30 and a barrier metal layer 29 having configuration of stacked layers made up of a tantalum (Ta) film and a tantalum nitride (TaN) film that have a film thickness of 10 to 30 nm. This first wiring layer 31 is formed simultaneously in the same process as that in which the first wiring layers 9A to 9C are formed in the circuit formation portion 18 as shown in FIG. 2.

On the first wiring insulating film 8, the second wiring insulating film (first inter-via layer insulation film) 11 is formed so as to have configuration of stacked layers made up of a silicon nitride film 32 having a film thickness of 10 to 50 nm, a low-dielectric constant film 33 having a film thickness of 150 to 300 nm, and a silicon oxide film 34 having a film thickness of 50 to 150 nm, in which the second wiring insulating film 11 a via hole (via wiring trench) 35 is formed, in which the via hole 35 a first via wiring layer 38 is formed which includes a copper layer 37 and a barrier metal layer 36 having configuration of stacked layers made up of a tantalum film and a tantalum nitride film that have a film thickness of 10 to 30 nm. This first via wiring layer 38 is formed in the same step as that in which the via wiring layer 12 is formed in such the circuit formation portion 18 as shown in FIG. 2.

On the second wiring insulating film 11, the third wiring insulation film 13 is formed so as to have configuration of stacked layers made up of a silicon nitride film 39 having a film thickness 10 to 50 nm, a low-dielectric constant film 40 having a film thickness of 150 to 300 nm, and a silicon oxide film 41 having a film thickness of 50 to 150 nm, in which the third wiring insulating film 13 a trench 42 is formed, in which the trench 42 a second wiring layer 45 is formed which includes a copper layer 44 and a barrier metal layer 43 having configuration of stacked layers made up of a tantalum film and a tantalum nitride film that have a film thickness of 10 to 30 nm. This is second wiring layer 45 is formed at a same time in the same process as that in which the second wiring layer 14 is formed in such a circuit formation portion 18 as shown in FIG. 2.

Subsequently, a second via wiring layer 52 having almost the same configuration as that of the first via wiring layer 38 and a third wiring layer 59 having almost the same configuration as that of the second wiring layer 45 are formed. It is to be noted that reference numerals 46 and 53 indicate a silicon nitride film reference numerals 47 and 54 indicate a low-dielectric constant film, reference numerals 48 and 55 indicate a silicon oxide film, a reference numeral 49 indicates aviahole (via wiring trench), reference numerals 50 and 57 indicate a barrier metal layer, reference numerals 51 and 58 indicate a copper layer, and a reference numeral 56 indicates a trench. Further, the first seal ring 21 is formed by interconnecting the contact 25 electrically connected with the N-type diffusion region 19, the first wiring layer 31, the first via wiring layer 38, the second wiring layer 45, the second via wiring layer 52, and the third wiring layer 59 which are all formed in such a manner as to extend in the film thickness direction of the first through fifth wiring insulating films 8, 11, 13, 15, and 16, and then the second and third seal rings 22 and 23 are formed similarly.

In one example, widths of the first wiring layer 31, the second wiring layer 45, and the third wiring layer 59 are selected to 0.28–2.0 $\mu$m and a spacing between the mutually adjacent wiring layers, the first wiring layer 31, the second wiring layer 45, and the third wiring layer is selected to 1.0 to 2.0 $\mu$m. Further, widths of the first via wiring layer 38 and the second via wiring layer 52 are selected to 0.1–0.48 $\mu$m and a spacing between the mutually adjacent wiring layers, the first via wiring layer 38 and the second via wiring layer 52 is selected to 1.0 to 2.0 $\mu$m.

As the low-dielectric constant films 33, 40, 47, and 54 making up a main portion of each of the wiring insulating films, (second through fifth wiring insulation films) 11, 13, 15, and 16 respectively, an organic film known as SiLK (registered trademark of Dow Chemical Company) is used in one example. This low-dielectric constant film has a dielectric constant that is several times as small as those of the silicon oxide film, silicon nitride film, and a like which have been used conventionally.

Surfaces of the (first through third) seal rings 21–23 are covered and protected by the passivation film 17 having configuration of stacked layers made up of a silicon nitride film 60 having a film thickness of 10 to 50 nm, a silicon oxide film 61 having a film thickness of 500 to 800 nm, a silicon oxide film 62 having a film thickness of 100 to 200 nm, and a silicon nitride film 63 having a film thickness of 1000 to 2000 nm.

In this configuration, the N-type diffusion region 19 and the contact 25 are shaped so as to match shapes of the first through third seal rings 21 through 23. That is, so as to match the shapes of the first through third seal rings 21 through 23 formed endlessly as described above, the N-type diffusion region 19 and the contact 25 are shaped endlessly along a periphery of the semiconductor chip 10 in such a manner as to surround the circuit formation portion 18. However, if it is confirmed that evidently water and a like will not penetrate into the protective insulation film 6 formed lower in level than the first wiring insulating film 8, the N-type diffusion region 19 and the contact 25 need not necessarily be shaped so as to match the shapes of the first through third seal rings 21 through 23 and may have any shape.

Figure 5:
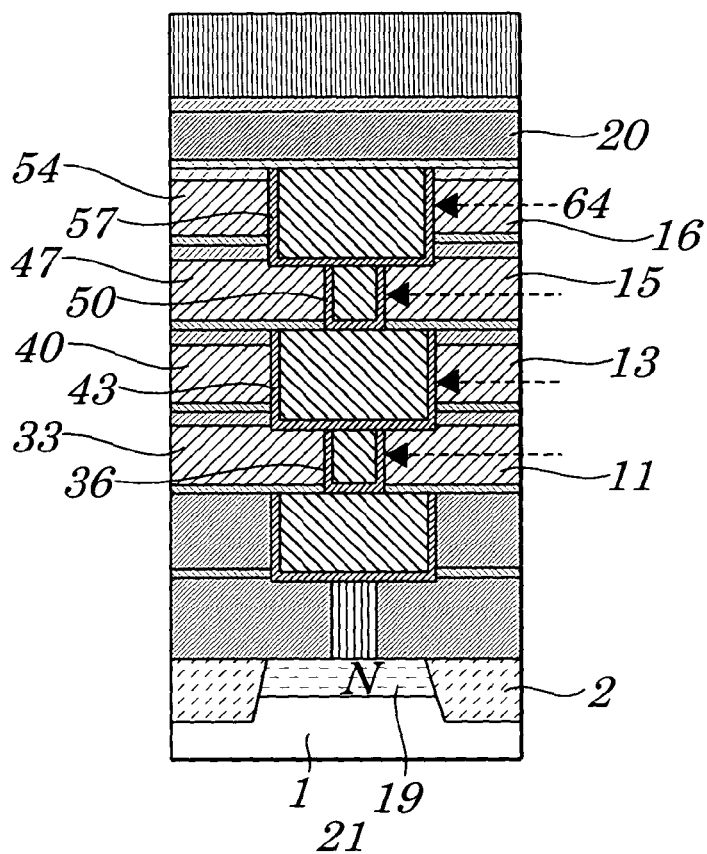
FIG. 5 is a cross-sectional view for showing how water and a like penetrates into the semiconductor device through a dicing face according to the first embodiment of the present invention.

As described above, in a semiconductor device provided with the three seal rings, the first through third seal rings, 21 to 23, as can be seen from FIG. 5, water and a like having penetrated in a direction of an arrow 64 into the low-dielectric constant films 33, 40, 47, and 54 making up the main portion of each of the second through fifth wiring insulating films 11, 13, 15, and 16 respectively is blocked from penetrating further deeply inward by the presence of the barrier metal layers 36, 43, 50, and 57 of, for example, the first seal ring 21 provided nearest the dicing face 20. That is, besides general use as a barrier (first copper-diffusion preventing film) to prevent copper from being diffused to surroundings from the copper wiring line buried in the wiring insulating film, the barrier metal layer can also be used so that it may act as a barrier against water and a like having penetrated from the surroundings as described above.

Figure 6:
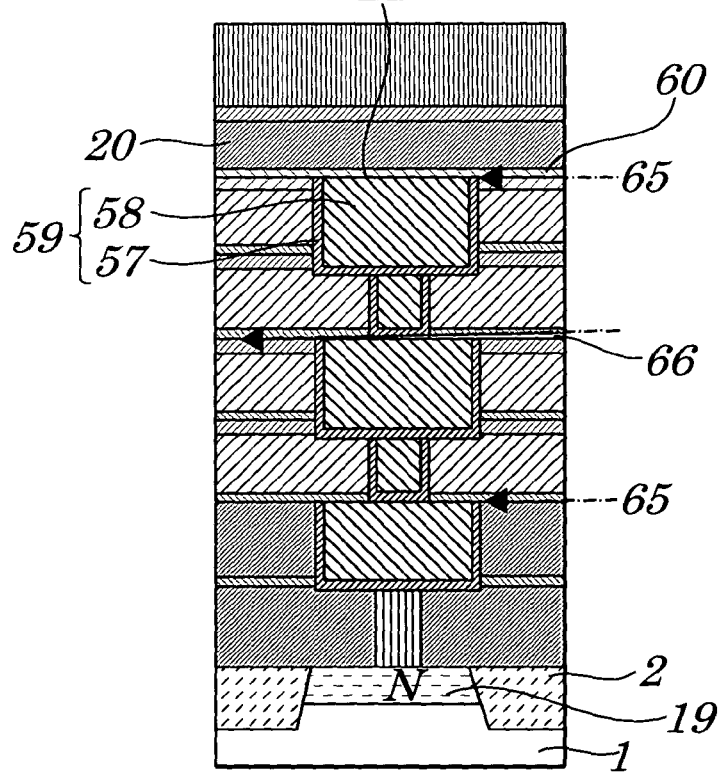
FIG. 6 is another cross-sectional view for showing how water and a like penetrates into the semiconductor device through the dicing face according to the first embodiment of the present invention.

Further, as shown in FIG. 6, water and a like having penetrated in a direction of an arrow 65 into a boundary between, for example, the copper layer 58 of the third wiring layer 59 and the silicon nitride film 60 is blocked from penetrating further deeply inward by good close contactness between the silicon nitride film 60 and the barrier metal layer 57 that covers the copper layer 58. Similarly, owing to excellent close contactness between the silicon nitride film 46 and the barrier metal layer 43 that covers the copper layer 44 in the case of the second wiring layer 45 in FIG. 3 or owing to excellent close contactness between the silicon nitride film 32 and the barrier metal layer 29 that covers the copper layer 30 in the case of the first wiring layer 31 in the FIG. 3, water and a like having penetrated into a boundary between the copper layer 44 and the silicon nitride film 46 or that between the copper layer 30 and the silicon nitride film 32 respectively is blocked from penetrating further deeply inward.

Further, as shown in FIG. 3, the silicon nitride films 32, 39, 46, 53, and a like that are formed at lower-part layers of the second through fifth wiring insulating films 11, 13, 15, 16, and a like are used so that they may act as a diffusion preventing film (second copper diffusion preventing film) for preventing copper from being diffused to surroundings from the copper layers 37, 44, 51, and 58 buried in the via hole 35, the trench 42, the via hole 49, and the trench 56 respectively, so that these silicon nitride films 32, 39, 46, 53, and a like have actions similar to those of the barrier metal layers 36, 43, 50, 57, and a like By utilizing barrier actions of the barrier metal layers 36, 43, 50, 57, and a like and of the silicon nitride films 32, 39, 46, 53, and a like, water and a like having penetrated through the dicing face 20 can be prevented from penetrating further deeply inward, so that basically even one seal ring is effective in the action.

As shown in FIG. 6, the first seal ring 21 nearest the dicing face 20 may peel off as indicated by an arrow 66 owing to chipping at the time of dicing. Therefore, in such a case, water and a like penetrates in a direction of the arrow 66 but is blocked from penetrating beyond the second seal ring 22 further inward because the second seal ring 22 is present inside the first seal ring 21 as shown in FIGS. 1 and 2. Furthermore, even if the second seal ring 22 is damaged by such chipping as described above, the third seal ring 23, which is present inside the second seal ring 22, acts as a backup, to block the water and a like from penetrating further deeply inward.

Figure 4A:
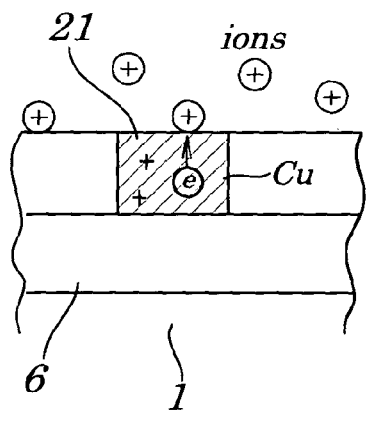
FIGS. 4A and 4B are illustrations for schematically explaining behaviors of the seal ring of the semiconductor device according to the first embodiment of the present invention.
Figure 4B:
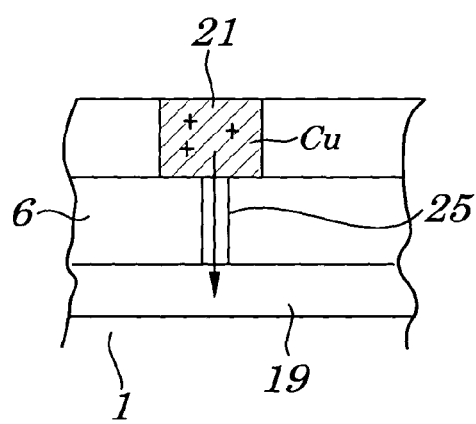

If the first through third seal rings 21 to 23 are exposed to plasma in a process of etching, CVD, and a like, ions having positive charge hit the semiconductor substrate 1, so that such a phenomenon occurs that the first through third seal rings 21 to 23 are deprived of their inner electrons by the ions to thereby charge the wiring layers positively. In this case, as shown in FIG. 4A, if, for example, the seal ring 21 is in an electrically floating state, it continues to accumulate charge in it until it is discharged, whereupon the substrate 1 is destroyed. In such a case, according to the present embodiment, as shown in FIG. 4B, for example, the first seal ring 21 is connected via the contact 25 to the N-type region 19, so that its charge can be released through the semiconductor substrate 1, thereby preventing destruction of the semiconductor substrate 1.

Figure 7:
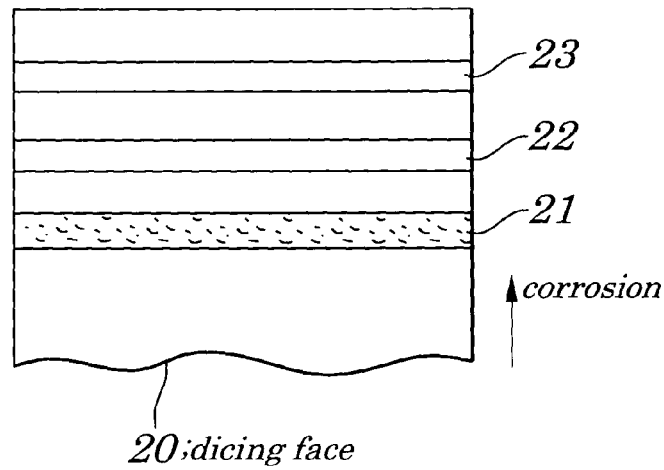
FIG. 7 is an illustration for schematically showing a result of conducting a pressure test on the semiconductor device in an atmosphere containing water according to the first embodiment of the present invention.

As a result of a pressure test conducted on the semiconductor device of the present embodiment, it has been observed that, as shown in FIG. 7, as water and a like penetrates through the dicing face 20, corrosion goes on in an arrow direction, to provide spotted contamination on a surface of the first seal ring 21 nearest the dicing face 20. However, such contamination has been observed on neither one of the surfaces of the second and third seal rings 22 and 23.

Figure 8:
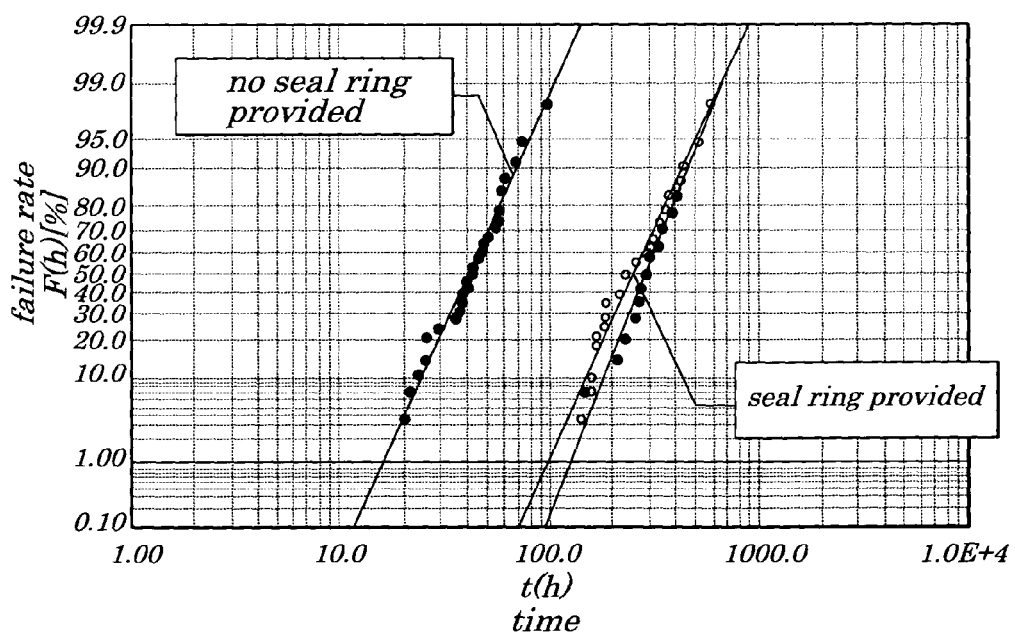
FIG. 8 is a graph for showing a result of a life test conducted on the semiconductor device according to the first embodiment of the present invention.

As can be seen from FIG. 8 in which its horizontal axis indicates time and its vertical axis indicates a failure rate, if a seal ring is provided as in the present embodiment, a life of the device can be improved by a factor of about ten as compared to the case where it is not provided.

Figure 9A:
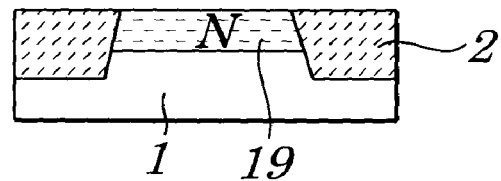
FIGS. 9A–9C are flow diagrams for showing a method for manufacturing the seal ring of the semiconductor device using a single damascene technology, along steps according to the first embodiment of the present invention.
Figure 9B:
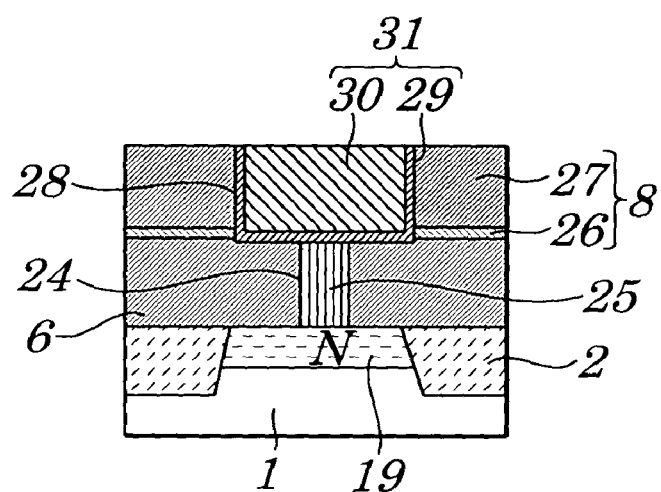
Figure 9C:
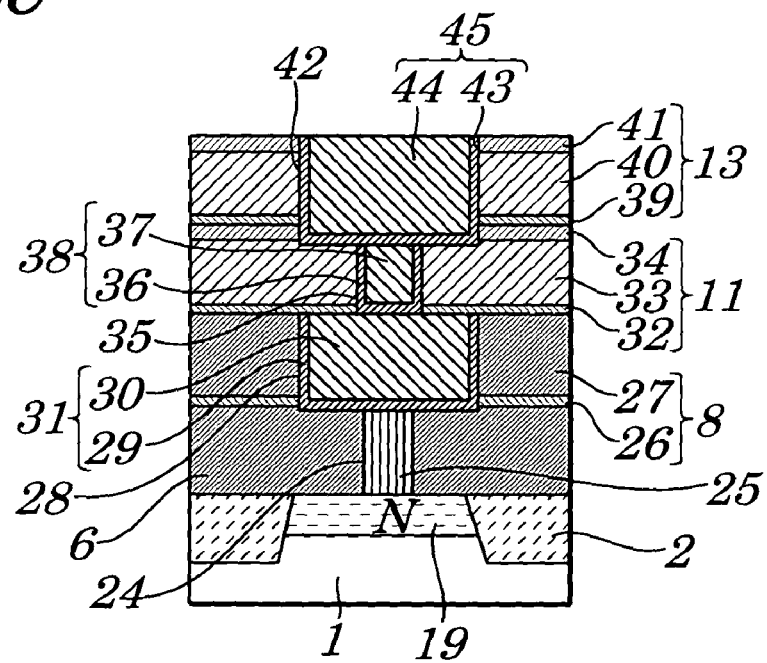
Figure 9D:
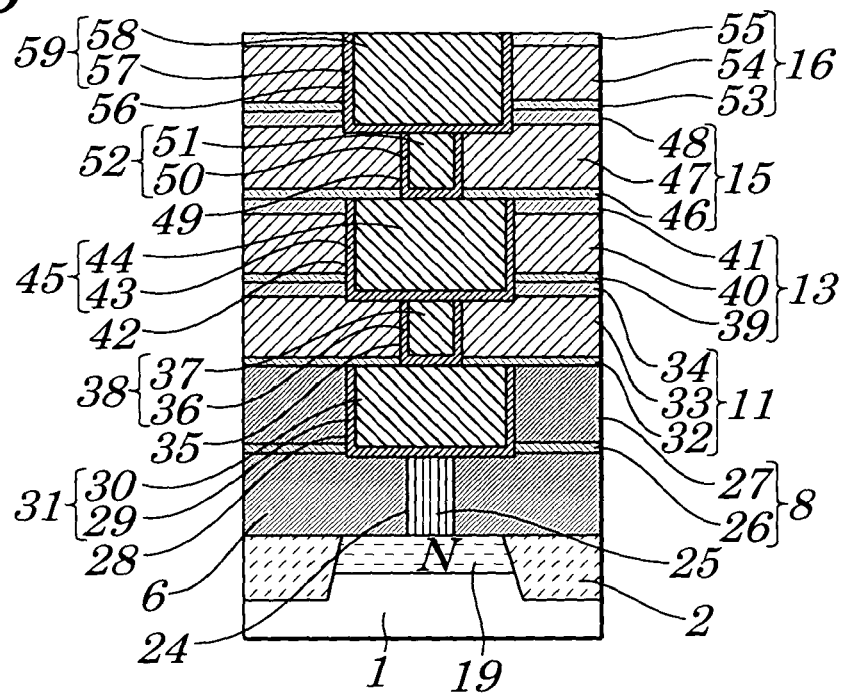
FIG. 9D is a continued flow diagram for showing the method for manufacturing the seal ring of the semiconductor device using the single damascene technology, along the steps according to the first embodiment of the present invention.
Figure 10:
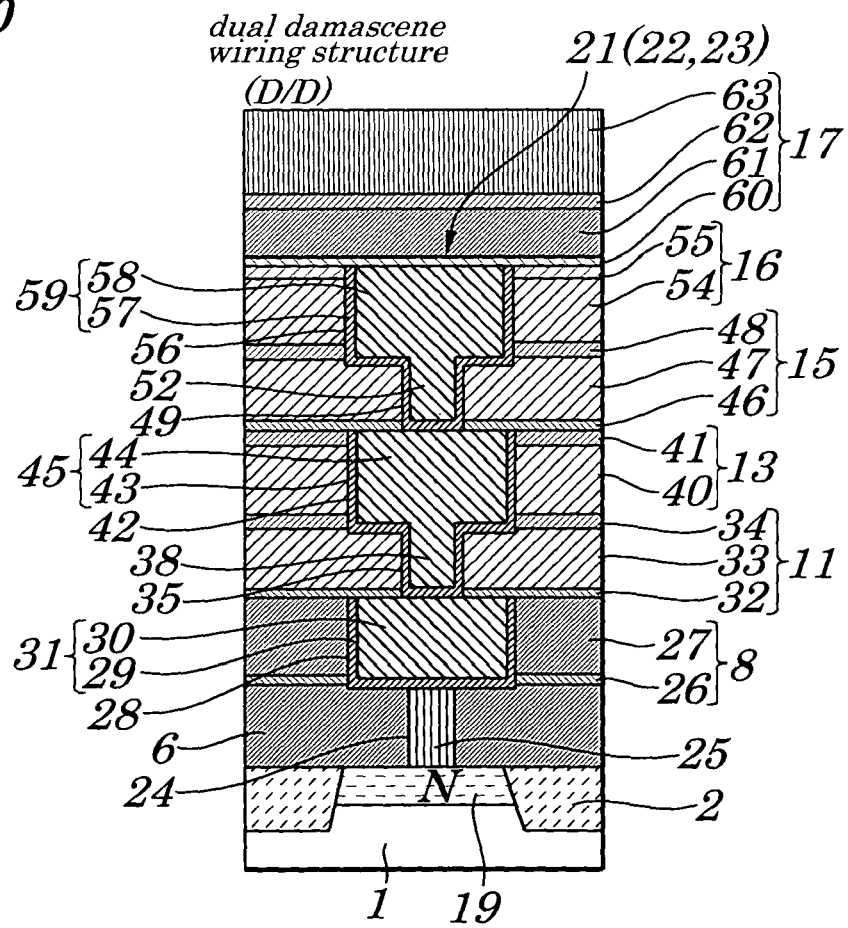
FIG. 10 is a cross-sectional view for showing a specific configuration of a seal ring of a semiconductor device according to a second embodiment of the present invention using a dual damascene wiring technology.

The following will describe a method for manufacturing a seal ring of a semiconductor device of the present embodiment using a single damascene technology, with reference to FIGS. 9 and 10 along steps. Note here that the method is described with reference to one example where only such a first seal ring 21 as shown in FIG. 3 is manufactured.

First, as shown in FIG. 9A, at the same time as forming the element isolation region 2 in the circuit formation portion 18 of the P-type silicon substrate 1, the element isolation region 2 is formed in a formation-expected region of a seal ring on the P-type silicon substrate 1. Next, at the same time as forming the pair of N-type diffusion regions 3 and 4 to provide source and drain regions in the circuit formation portion 18, the N-type diffusion region 19 is formed. It is to be noted that the pair of N-type diffusion regions 3 and 4 are formed by forming a silicon oxide film and a poly-silicon film sequentially on the substrate 1, then patterning them into a desired shape to thereby form the gate portion 5 made up of a gate insulation film and a gate electrode, and then injecting ions of an N-type impurity by self-alignment using the gate portion 5 as a mask. Therefore, the N-type diffusion region 19 is also formed at the same time and by roughly the same process as the pair of the N-type diffusion regions 3 and 4.

Next, as shown in FIG. 9B, the protective insulation film 6 made of a silicon oxide film having a film thickness of 500 to 800 nm is formed throughout the surface by CVD and then, by plasma etching by use of a photolithographic technology, the contact hole 24 required to form the seal ring is formed. Next, a tungsten layer and a barrier metal layer (not shown) having configuration of stacked layers made up of a titanium film having a film thickness of 5–15 nm and a titanium nitride film having a film thickness of 10 to 20 nm are formed throughout the surface by CVD and sputtering and then unnecessary portions of the barrier metal and tungsten layers are removed by CMP, to make up the contact 25 of the barrier metal and the tungsten that are left (buried) only in the contact hole 24. Next, the silicon nitride film 26 having a film thickness of 10 to 50 nm and the silicon oxide film 27 having a film thickness of 200 to 400 nm are stacked sequentially by CVD to thereby form the first wiring insulating film 8 and then the trench 28 is formed in the first wiring insulating film 8 by plasma etching. Next, a tantalum nitride film and a tantalum film that have a film thickness of 10 to 30 nm are sequentially stacked by sputtering to form the barrier metal layer 29, then a copper layer having a film thickness of 50 to 150 nm is formed by sputtering and then plated to be completely buried into the trench 28. Next, unnecessary portions of the barrier metal and copper layers are removed by CMP, to make up the first wiring layer 31 of portions of the barrier metal layer 29 and the copper layer 30 that are left only in the trench 28.

Next, as shown in FIG. 9C, the silicon nitride film 32 having a film thickness of 10 to 50 nm, the low-dielectric constant film 33 having a film thickness of 150 to 300 nm, and the silicon oxide film 34 having a film thickness of 50 to 150 nm are sequentially stacked throughout the surface by CVD to thereby form the second wiring insulating film (first inter-via layer insulation film) 11 and then the via hole 35 is formed in the second wiring insulating film 11 by plasma etching. Next, a tantalum nitride film and a tantalum film that have a film thickness of 10 to 30 nm are sequentially stacked throughout the surface by sputtering to thereby form the barrier metal layer 36, then a copper layer having a film thickness of 50 to 150 nm is formed by sputtering and then plated to be completely buried into the via hole 35. Next, unnecessary portions of the barrier metal and copper layers are removed by CMP to make up the first via wiring layer 38 of portions of the barrier metal layer 36 and the copper layer 37 that are left only in the via hole 35.

Next, the silicon nitride film having a film thickness of 10 to 50 nm, the low-dielectric constant film 40 having a film thickness of 150 to 300 nm, and the silicon oxide film 41 having a film thickness of 50 to 150 nm are sequentially stacked throughout the surface by CVD to form the third wiring insulating film 13 and then the trench 42 is formed in the third wiring insulating film 13 by plasma etching. Next, a tantalum nitride film and a tantalum film that have a film thickness of 10 to 30 nm are formed sequentially throughout the surface by sputtering to form the barrier metal layer 43, then the copper layer 44 having a film thickness of 50 to 150 nm is formed by sputtering and then plated to be completely buried into the trench 42. Next, unnecessary portions of the barrier metal layer 43 and the copper layer 44 are removed by CMP to make up the second wiring layer 45 of portions of the barrier metal layer 43 and the copper layer 44 that are left only in the trench 42.

Subsequently, as shown in FIG. 9D, the second via wiring layer 52 is formed so as to be connected with the second wiring layer 45 in much the same way as the first via wiring layer 38 is formed, then the third wiring layer 59 is formed so as to be connected with the second via wiring layer 52 in much the same way as the second wiring layer 45 is formed.

Next, the silicon nitride film 60 having a film thickness of 10 to 50 nm, the silicon oxide film 61 having a film thickness of 500 to 800 nm, the silicon oxide film 62 having a film thickness of 100 to 200 nm, and the silicon nitride film 63 having a film thickness of 1000 to 2000 nm are sequentially stacked throughout the surface of the fifth wiring insulating film 16 by CVD, to form the passivation film 17, thereby completing a structure of FIG. 3.

According to the manufacturing method described above, by using the single damascene wiring technology, it is possible to form the first through third seal rings 21 to 23 simultaneously in the same process as that in which a multi-layer interconnection is formed in the circuit formation portion 18, so that the first through third seal rings 21 to 23 can be provided simply without increasing costs.

As described above, according to the semiconductor device of the present embodiment, the first through third seal rings 21 to 23 made up of the conductive layers extended in a film-thickness direction of the first through fifth wiring insulating films 8, 11, 13, 15, and 16 so as to be electrically connected one after another to the N-type diffusion regions 19 surrounded by the element isolation region 2 are provided as insulated from each other along the periphery of the semiconductor chip 10 in such a manner as to surround the circuit formation portion 18, so that it is possible to block water and a like, if having penetrated through the dicing face 20, from penetrating further deeply inward by the presence of the second or the third seal ring 22 or 23.

Further, according to the manufacturing method of the present embodiment, by using the single damascene wiring technology, it is possible to form the first through third seal rings 21 to 23 at a same time in the same process as that in which the multi-layer interconnection is formed in the circuit formation portion 18, so that the first through third seal rings 21 to 23 can be provided simply without increasing the costs.

It is, therefore, possible to improve moisture resistance sufficiently in a configuration in which the first through third seal rings 21 to 23 surrounding the circuit formation portion 18 is provided.

Second Embodiment

A semiconductor device according to the second embodiment of the present invention greatly differs in configuration from that of the first embodiment in that seal rings are manufactured using a dual damascene wiring technology.

As shown in FIG. 10, in a configuration of the semiconductor device of the present embodiment in which first through third seal rings 21 to 23 made up of conductive layers extended in a film-thickness direction of first through fifth wiring insulating films 8, 11, 13, 15, and 16 so as to be electrically connected one after another to the N-type diffusion regions 19 surrounded by an element isolation region 2 are provided as insulated from each other along a periphery of a semiconductor chip 10 in such a manner as to surround a circuit formation portion 18, a second wiring layer 45 and a first via wiring layer 38 that make up a conductive path are formed integrally and simultaneously, while a third wiring layer 59 and a second via wiring layer 52 are formed integrally and simultaneously. It is to be noted that although FIG. 10 shows one example of such a configuration that the first seal ring 21 is provided, the second and third seal rings 22 and 23 also have the same configuration.

Except for these, the present embodiment is roughly the same as the first embodiment. Therefore, components of FIG. 10 that correspond to those of FIG. 3 are indicated by the same reference numerals and description thereof is omitted.

According to the present embodiment, by providing the first through third seal rings 21 to 23 using the dual damascene wiring technology, the second wiring layer 45 and first via wiring layer 38 that are vertical adjacent to each other and the third wiring layer 59 and the second via wiring layer 52 that are vertically adjacent to each other can be formed integrally and simultaneously respectively, thus further simplifying formation of the first through third seal rings 21 to 23. Further, since the wiring layer and the via wiring layer are formed integrally, there exists no boundary between them, thereby providing an advantage that water and a like having penetrated through a dicing face can be blocked securely from penetrating further deeply inward.

Figure 11A:
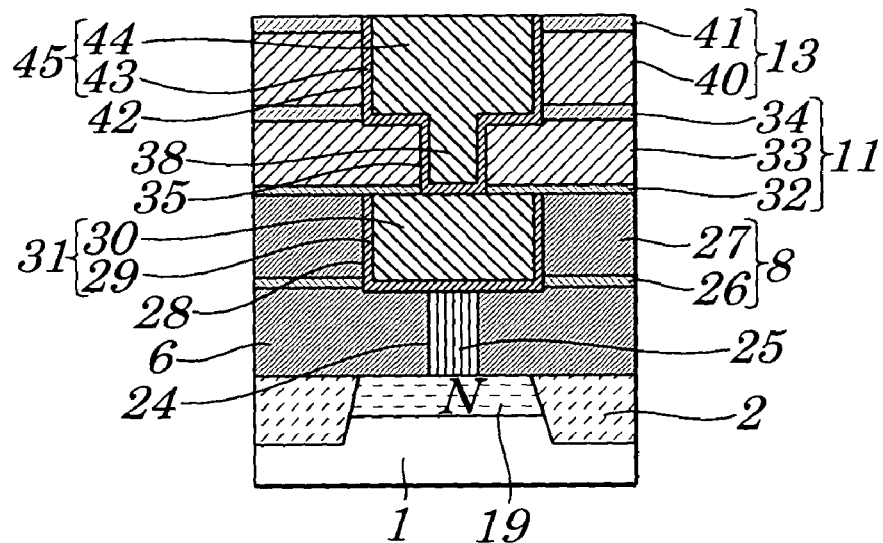
FIGS. 11A–11B are flow diagrams for showing a main part of a method for manufacturing the semiconductor device using the dual damascene technology, along steps according to the second embodiment of the present invention.
Figure 11B:
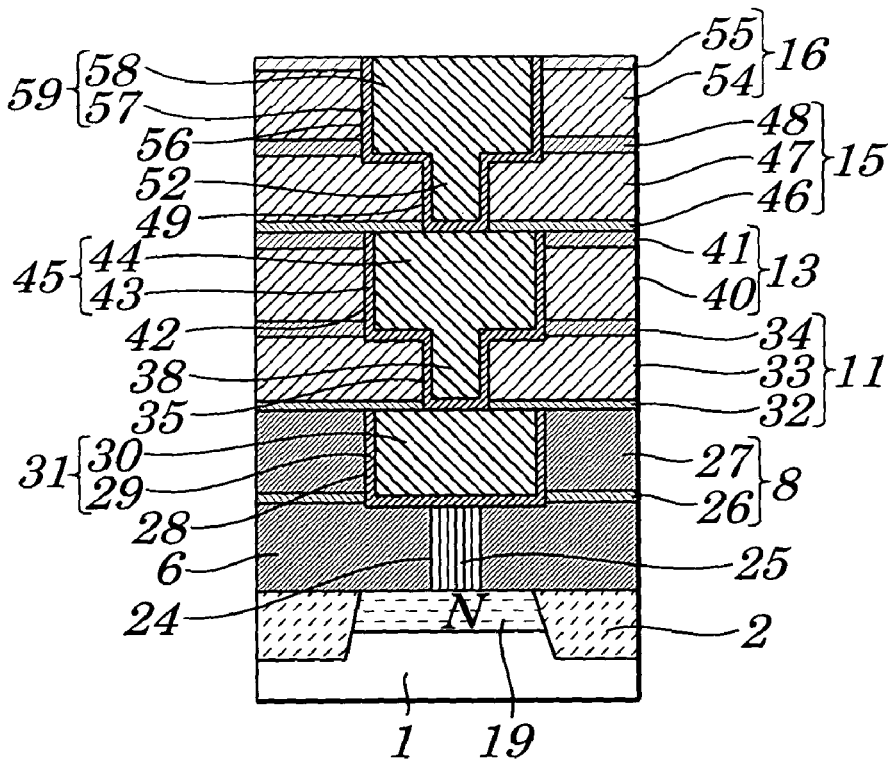

The following will describe a method for manufacturing the semiconductor device according to the present embodiment using the dual damascene wiring technology with reference to FIGS. 11A and 11B along steps. Note here that the method has been described with reference to one example where only such the first seal ring 21 as shown in FIG. 10 is formed.

After a step of FIG. 9B of the first embodiment, as shown in FIG. 11A a silicon nitride film 32 having a film thickness of 10 to 50 nm, a low-dielectric constant film 33 having a film thickness of 150 to 300 nm, and a silicon oxide film 34 having a film thickness of 50 to 150 nm are stacked sequentially by CVD to thereby form the second wiring insulating film (first inter-via layer insulation film) 11 and then a low-dielectric constant film 40 having a film thickness of 150 to 300 nm and a silicon oxide film 41 having a film thickness of 50 to 150 nm are stacked sequentially throughout the surface by CVD to thereby form the third wiring insulating film 13. Next, at the same time as forming a trench 42 in the third wiring insulating film 13 by plasma etching, a first via hole 35 is formed in the second wiring insulating film 11. Next, a tantalum nitride film and a tantalum film that have a film thickness of 10 to 30 nm are stacked sequentially throughout the surface by sputtering to thereby form a barrier metal layer 43, then a copper layer 44 having a film thickness of 50 to 150 nm is formed by sputtering and then plated to be completely buried into the trench 42 and the first via hole 35. Next, unnecessary portions of the barrier metal layer 43 and copper layer 44 are removed by CMP to thereby make up a second wiring layer 45 of portions of the barrier metal layer 43 and the copper layer 44 that are left only in the trench 42 and the first via hole 35, while forming first via wiring layer 38 simultaneously.

Subsequently, as shown in FIG. 11B, after a fourth wiring insulating film 15 and a fifth wiring insulating film 16 are formed, a second via hole 49 is formed simultaneously with a trench 56 and also a second via wiring layer 52 is formed simultaneously with a third wiring layer 59 and, further, a passivation film 17 not shown in FIGS. 11A and 11B is formed, thereby completing a structure of FIG. 10.

As described above, by the configuration of the present embodiment also, almost the same effects as those described with the first embodiment can be obtained.

In addition, by the configuration of the present embodiment, the first through third seal rings 21 to 23 are provided by the dial damascene wiring technology, so that there exists no boundary between a bottom of the wiring and a top of the wiring layer, thus improving an effect of blocking penetration of water and a like Third Embodiment A semiconductor device according to the third embodiment of the present invention greatly differs in configuration from that of the first embodiment in that a slit-like notch (hereinafter referred to as slit) is formed in each of first through third seal rings 21 to 23.

Figure 12:
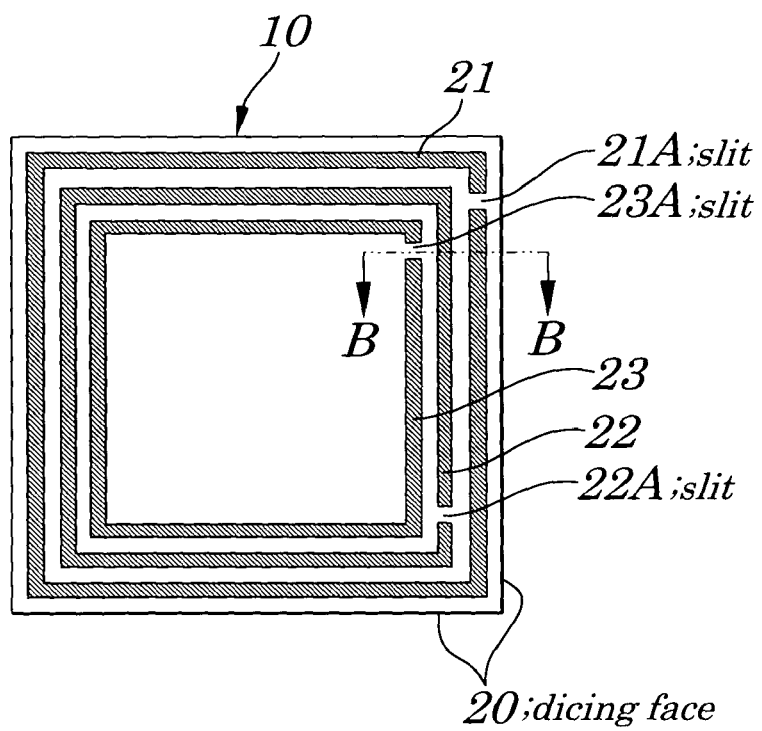
FIG. 12 is a plan view for showing a configuration of a semiconductor device according to a third embodiment of the present invention.
Figure 13:
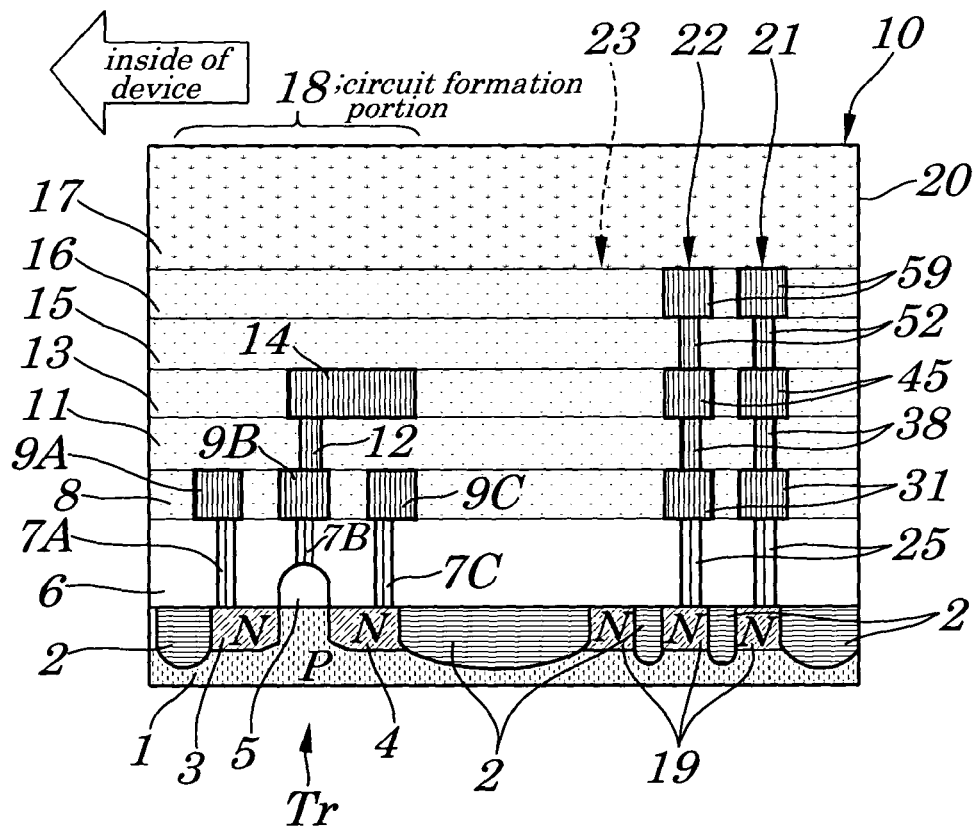
FIG. 13 is a cross-sectional view taken along line B—B of FIG. 12.
Figure 14:
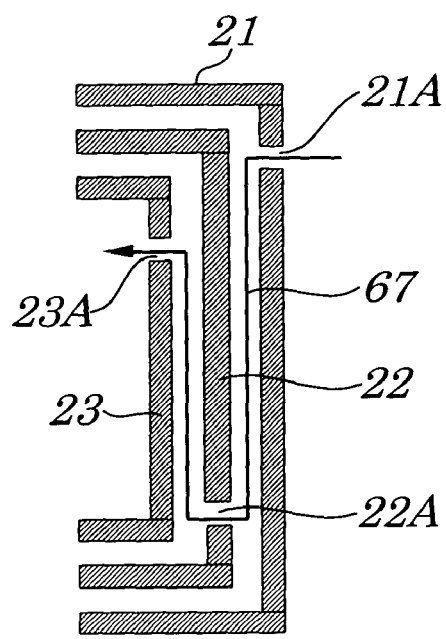
FIG. 14 is a plan view for showing how water and a like 尤 penetrates into the semiconductor device through a dicing face according to the third embodiment of the present invention.

As shown in FIGS. 12 and 13, in a configuration of the semiconductor device of the present embodiment in which first through third seal rings 21 to 23 made up of conductive layers extended in a film-thickness direction of first through fifth wiring insulating films 8, 11, 13, 15, and 16 so as to be electrically connected one after another to the N-type diffusion regions 19 surrounded by an element isolation region 2 are provided as insulated from each other along a periphery of a semiconductor chip 10 in such a manner as to surround a circuit formation portion 18, three slits 21A to 23A are formed at length-directional parts of the first through third seal rings 21 to 23 respectively in such a manner that length-directional positions of at least mutually adjacent ones of the first through third seal rings 21 to 23 at which the slits 21A to 23A are formed respectively may not be aligned with each other.

In this configuration, the N-type diffusion region 19 and a contact 25 are shaped so as to match shapes of the first through third seal rings 21 to 23. That is, in order to match the shapes of the first through third seal rings 21 to 23 provided with the respective slits 21A to 23A as described above, the N-type diffusion region 19 and the contact 25 are shaped in such a manner that the 21A to 23A slits may be formed at a position along a periphery of the semiconductor chip 10 that surrounds the circuit formation portion 18. However, if it is confirmed that evidently water and a like will not penetrate into a protective insulation film 6 formed lower in level than the first wiring insulating film 8, the N-type diffusion region 19 and the contact 25 need not necessarily be shaped so as to match the shapes of the first through third seal rings 21 to 23 and may have any shape.

According to the present embodiment, a penetration path 67 of water and a like has such a distance as to be given by connecting the slits 21A to 23A in the respective first through third seal rings 21 to 23 one after another, so that the distance is large enough to block penetration of water and a like. The blocking becomes more effective by setting the formation positions of the slits 21A to 23A in such a manner that the distance of the penetration path 67 may be larger. Further, the penetration path 67 of water and a like can thus be elongated, thus sufficiently relaxing occurrence of Electro-Migration (EM).

Figure 28:
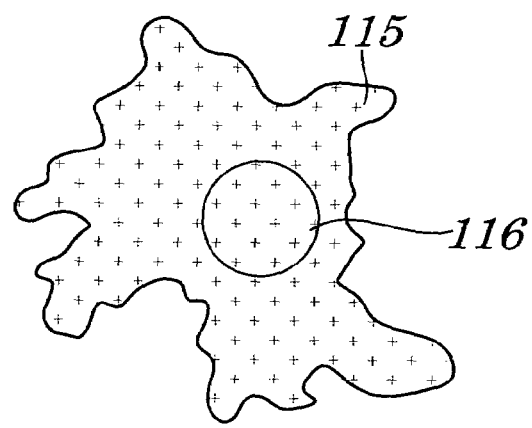
FIG. 28 is another illustration for schematically showing the problem of the conventional semiconductor device.

Further, according to the present embodiment, the first through third seal rings 21 to 23 are each configured not to be endless in shape, so that even if a magnetic field occurs in a process of manufacturing the semiconductor device, no induced current occurs on the first through third seal rings 21 to 23. Therefore, such a phenomenon is eliminated that a copper layer breaks out as described with reference to FIG. 28.

The following will describe a method for manufacturing the first through third seal rings 21 to 23 of the semiconductor device of the present embodiment using a damascene wiring technology with reference to FIGS. 15A–15D (and referencing FIG. 13), along steps.

Figure 15A:
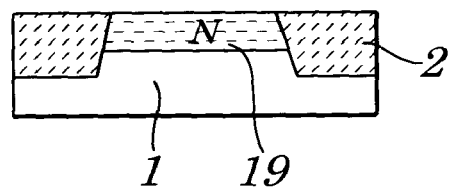
FIGS. 15A–15B are flow diagrams for showing a method for forming a slit in a seal ring of the semiconductor device using a single damascene technology, along steps according to the third embodiment of the present invention.

First, as shown in FIG. 15A, at the same time as forming the element isolation region 2 in the circuit formation portion 18 of a P-type silicon substrate 1, the element isolation region 2 is formed in a region on the P-type silicon substrate 1 in which the first through third seal rings 21 to 23 are expected to be formed. Next, at the same time as forming in the circuit formation portion 18, one pair of N-type diffusion regions 3 and 4 (FIG. 13) that provide source and drain regions, the N-type diffusion region 19 is formed.

Figure 15B:
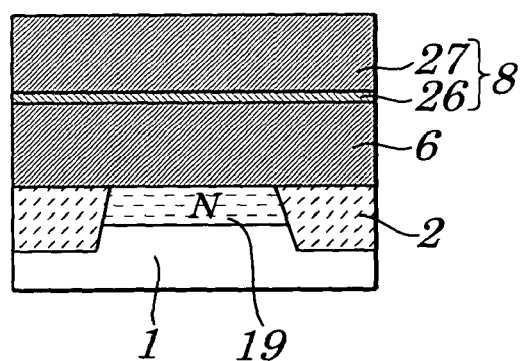

Next, as shown in FIG. 15B, in an example of forming, for example, the slit 23A in the third seal ring 23, in a condition where a photolithographic resist mask (not shown) is applied only on a slit formation-expected region (not shown), the protective insulation film 6 and the first wiring insulating film 8 having configuration of stacked layers made up of a silicon nitride film 26 and a silicon oxide film 27 are etched off sequentially in the seal ring formation-expected region (not shown). As a result, in the slit formation-expected region (not shown), where the resist mask (not shown) is applied beforehand, the protective insulation film 6, the silicon nitride film 26, and the silicon oxide film 27 are all left as not being etched off.

Figure 15C:
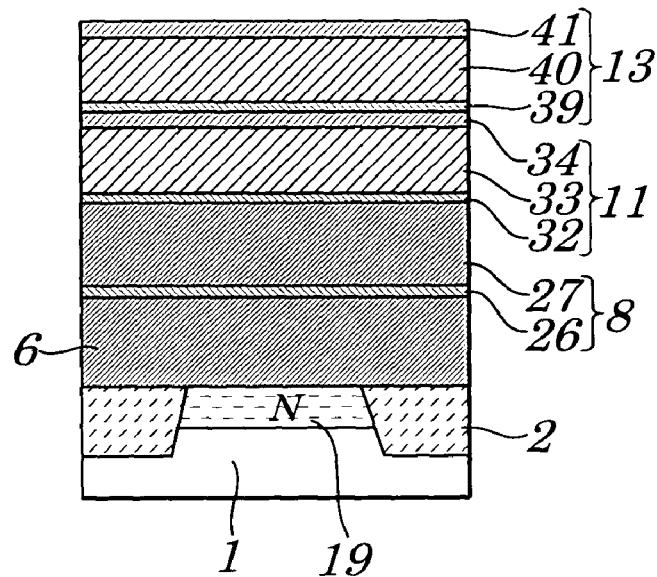
FIGS. 15C–15D are continued flow diagrams for showing the method for forming the slit in the seal ring of the semiconductor device using the single damascene technology, along the steps according to the third embodiment of the present invention.

Next, as shown in FIG. 15C, in a condition where a photolithographic resist mask (not shown) is applied on the slit formation-expected region (not shown) as described above, the second wiring insulating film 11 having configuration of stacked layers made up of a silicon nitride film 32, a low-dielectric constant film 33, and a silicon oxide film 34 and the third wiring insulating film 13 having configuration of stacked layers made up of a silicon nitride film 39, a low-dielectric constant film 40, and a silicon oxide film 41 are etched off sequentially in the seal ring formation-expected region (not shown). At this moment also, in the slit formation-expected region (not shown), where the resist mask (not shown) is applied beforehand, the silicon nitride film 32, the low-dielectric constant film 33, the silicon oxide film 34, the silicon nitride film 39, the low-dielectric constant film 40, and the silicon oxide film 41 are all left as not being etched off.

Figure 15D:
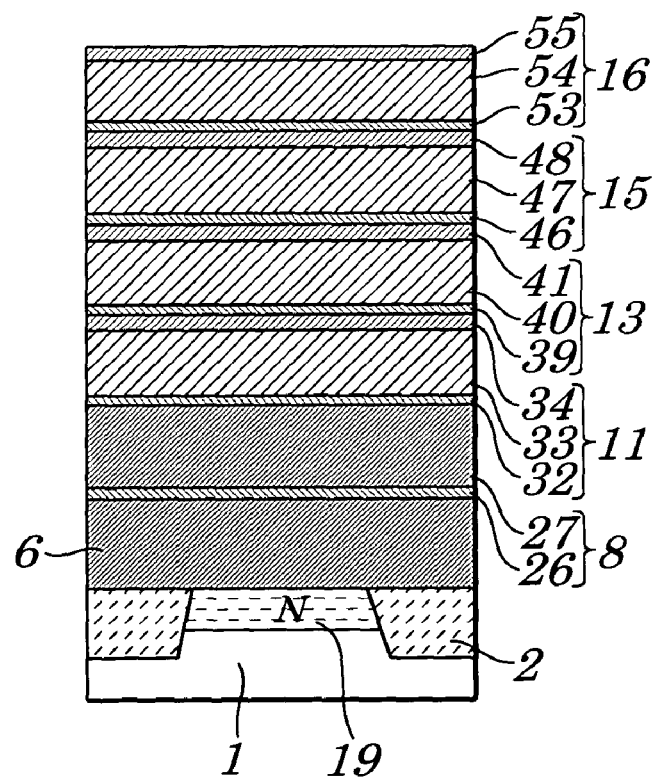

Next, as shown in FIG. 15D, in a condition where a photolithographic resist mask (not shown) is applied on the slit formation-expected region (not shown) as described above, the fourth wiring insulating film 15 having configuration of stacked layers made up of a silicon nitride film 46, a low-dielectric constant film 47, and a silicon oxide film 48 and the fifth wiring insulating film 16 having configuration of stacked layers made up of a silicon nitride film 53, a low-dielectric constant film 54, and a silicon oxide film 55 are etched off sequentially. At this moment also, in the slit formation-expected region (not shown), where the resist mask (not shown) is applied beforehand, the silicon nitride film 46, the low-dielectric constant film 47, the silicon oxide film 48, the silicon nitride film 53, the low-dielectric constant film 54, and the silicon oxide film 55 are all left as not being etched off.

In such a manner, the slit 23A is formed in the slit formation-expected region (not shown) of the third seal ring 23. By performing the similar processing on the first and second seal rings 21 and 23 also, the slits 21A and 22A can be formed respectively.

As described above, by the configuration of the present embodiment too, it is possible to obtain roughly the same effects as those described with the first embodiment.

In addition, by the configuration of the present embodiment, the slit is formed in each of the seal rings, so that an induced current can be prevented from occurring on any of the seal rings even if it is placed in a magnetic field.

Fourth Embodiment

A semiconductor device according to the fourth embodiment of the present invention greatly differs in configuration from that of the first embodiment in that a seal ring is provided as a countermeasure against pad cracks.

Figure 16:
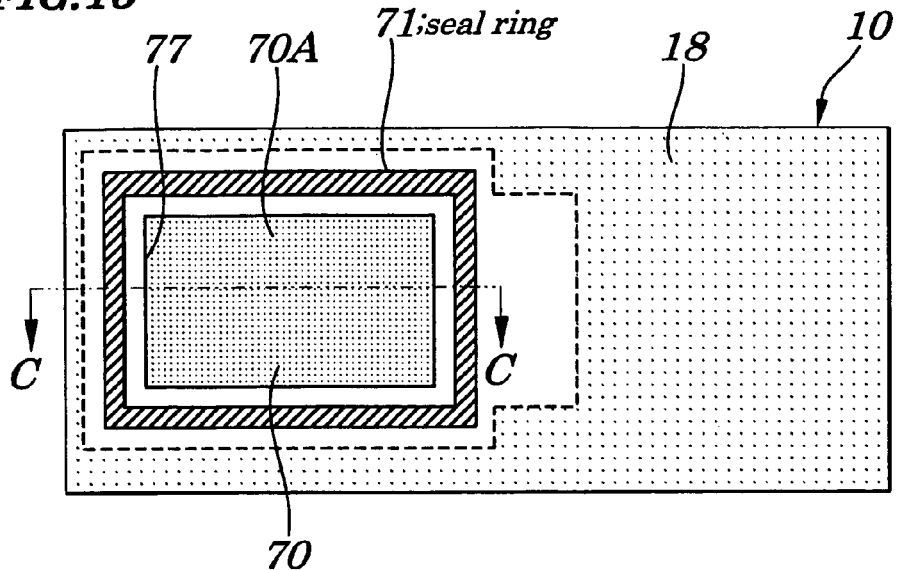
FIG. 16 is a plan view for showing a semiconductor device according to a fourth embodiment of the present invention.
Figure 17:
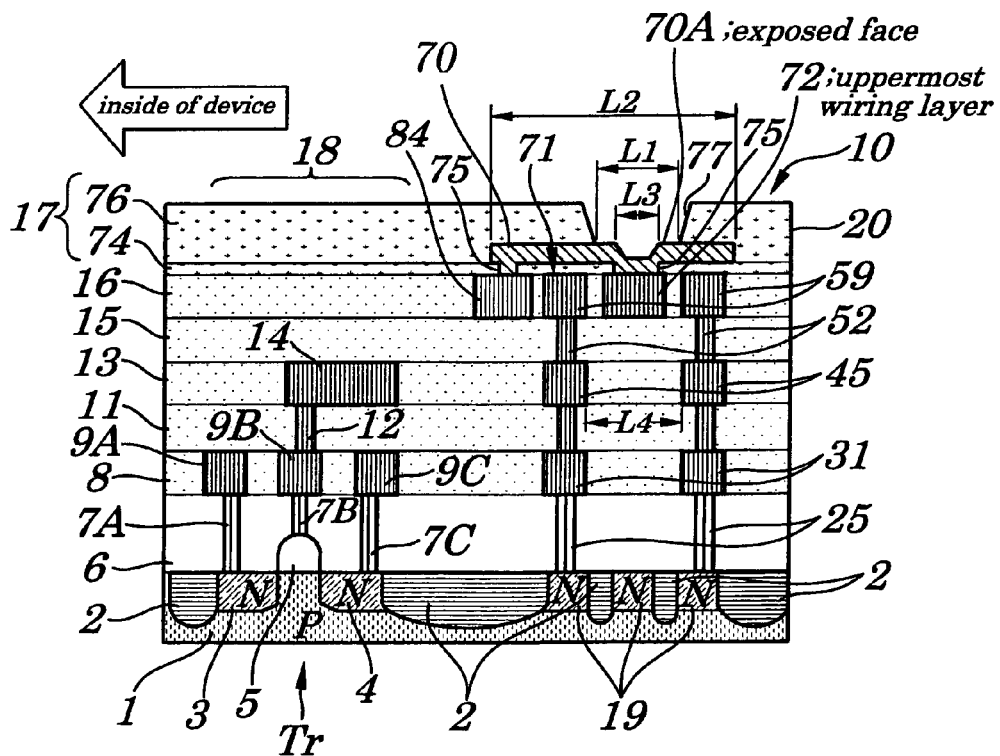
FIG. 17 is a cross-sectional view taken along line C—C of FIG. 16.

As shown in FIGS. 16 and 17, in a configuration of the semiconductor device of the present embodiment in which an assembly pad 70 is provided on a surface of a semiconductor substrate 1, a seal ring 71 made up of a conductive layer extended in a film-thickness direction of first through fifth wiring insulating films 8, 11, 13, 15, and 16 so as to be electrically connected one after another to N-type diffusion regions 19 surrounded by an element isolation region 2 is provided endlessly in such a manner as to surround the assembly pad 70. This seal ring 71 is, as shown in FIG. 17, formed by connecting a contact 25 electrically connected with the N-type diffusion region 19, a first wiring layer 31, a first via wiring layer 38, a second wiring layer 45, a second via wiring layer 52, and a third wiring layer 59 one after another.

The assembly pad 70 is made up of a 400 to 300 nm thick layer made of aluminum or aluminum-based metal and, as shown in FIG. 17, drawn out from a desired circuit element formed in a circuit formation portion 18 and connected to an uppermost wiring layer 72 and an external terminal layer 84 both having a film thickness of 300 to 2000 nm that are formed simultaneously with the third wiring layer 59 and that are made of copper or copper-based metal. It is to be noted that the uppermost wiring layer 72 and a like are covered by an insulation film 74 made of a silicon oxide film ($SiO_2$), a silicon nitride film (SiN), a silicon oxy-nitride film (SiON) film, or a like that has a film thickness of 100 to 2000 nm, over which uppermost wiring layer 72, the assembly pad 70 is arranged through a contact hole 75 formed in the insulation film 74.

The assembly pad 70 is in turn covered by a cover insulation film 76 made of a poly-imide film, a silicon nitride film, a silicon oxy-nitride film, or a like that has a film thickness of 1–10 $\mu$m, in such a configuration that an exposed face 70A exposed through an opening 77 formed in the cover insulation film 76 is arranged directly on the uppermost wiring layer 72. At the time of assembly of an LSI, a wire is bonded onto the exposed face 70A of the assembly pad 70 to electrically interconnect each circuit element and an outside of the LSI. Alternatively, the assembly pad 70 is used also as a connection terminal in the case of performing flip-chip bonding for stacking the LSI with other semiconductor chips to interconnect them or face-down bonding of a semiconductor chip on a wiring substrate. Furthermore, on a desired wiring insulating film, there is formed a wiring line (not shown) coming from the outside for connecting to the seal ring 71.

It is to be noted that as a specific method for forming the seal ring 71, the single damascene wiring technology employed to form the first through third seal rings 21 to 23 in the first embodiment described with reference to FIGS. 9A–9D or the dual damascene wiring technology employed to form the same first through third seal rings 21 to 23 in the second embodiment described with reference to FIG. 10 can be applied as it is and so description thereof is omitted.

In the present configuration, an inner size L1 of a bottom of the opening in the cover insulation film 76, an outer size L2 of the assembly pad 70, a contact hole size L3, and an inner size L4 of the seal ring 71 are set so as to satisfy relationships of L1<L4 and L1<L2 as an indispensable restriction in design so that the opening 77 in the cover insulation film 76 may be within the seal ring 71. From a viewpoint of assembly, on the other hand, a relationship between L1 and L3 can be set arbitrarily.

As described above, in a semiconductor device in which the seal ring 71 is provided in such a manner as to surround the assembly pad 70, even if a pad crack occurs due to a load applied at the time of, for example, wire bonding for bonding a wire onto the exposed face 70A of the assembly pad 70 at the time of assembly of an LSI, it is possible to block water and a like, if having penetrated through a dicing face, from penetrating further deeply inward by the presence of the seal ring 71.

It is to be noted that in mostly the same way as the assembly pad 70 is provided, a characteristics evaluation pad for evaluating characteristics of a discrete circuit element such as a transistor or a resistor and a screening evaluation pad for screening based on evaluation of the characteristics are provided on the surface of the semiconductor substrate 1. These pads are shaped in roughly the same structure as that of the assembly pad 70. In a process of, for example, shipping and screening a product, a test probe of an electrical measurement apparatus is brought in contact with the characteristics evaluation pad or the screening evaluation pad, to perform characteristics evaluation or screening evaluation respectively. In this case, a load due to contacting of the test probe is applied to these pads, so that a pad crack is liable to occur, to deteriorate moisture resistance as in the case of the assembly pad 70. Therefore, also in a case where the characteristics evaluation pad or the screening evaluation pad is provided in place of the assembly pad 70, by arranging a seal ring similar to the seal ring 71 in such a manner as to surround these pads, it is possible to block, by the presence of the seal ring 71, water and a like, if having penetrated through the dicing face, from penetrating further deeply inward even when a pad crack has occurred owing to a load being applied when the test probe has come in contact with any one of these pads.

As described above, according to the semiconductor device of the present embodiment, the seal ring 71 made up of the conductive layers extended in a film-thickness direction of the first through fifth wiring insulating films 8, 11, 13, 15, and 16 so as to be electrically connected one after another to the N-type diffusion regions 19 surrounded by the element isolation region 2 is provided in such a manner as to surround the assembly pad 70, the characteristics evaluation pad, or the screening evaluation pad, so that it is possible to block water and a like from penetrating inward by the presence of the seal ring 71 even if a pad crack occurs.

It is, therefore, possible to improve moisture resistance sufficiently even if a pad crack occurs in a configuration wherein an assembly pad, a characteristics evaluation pad, or a screening evaluation pad is provided.

Fifth Embodiment

A semiconductor device according to the fifth embodiment of the present invention greatly differs in configuration from that of the fourth embodiment in that an assembly pad 70 is provided as shifted in arrangement.

Figure 18:
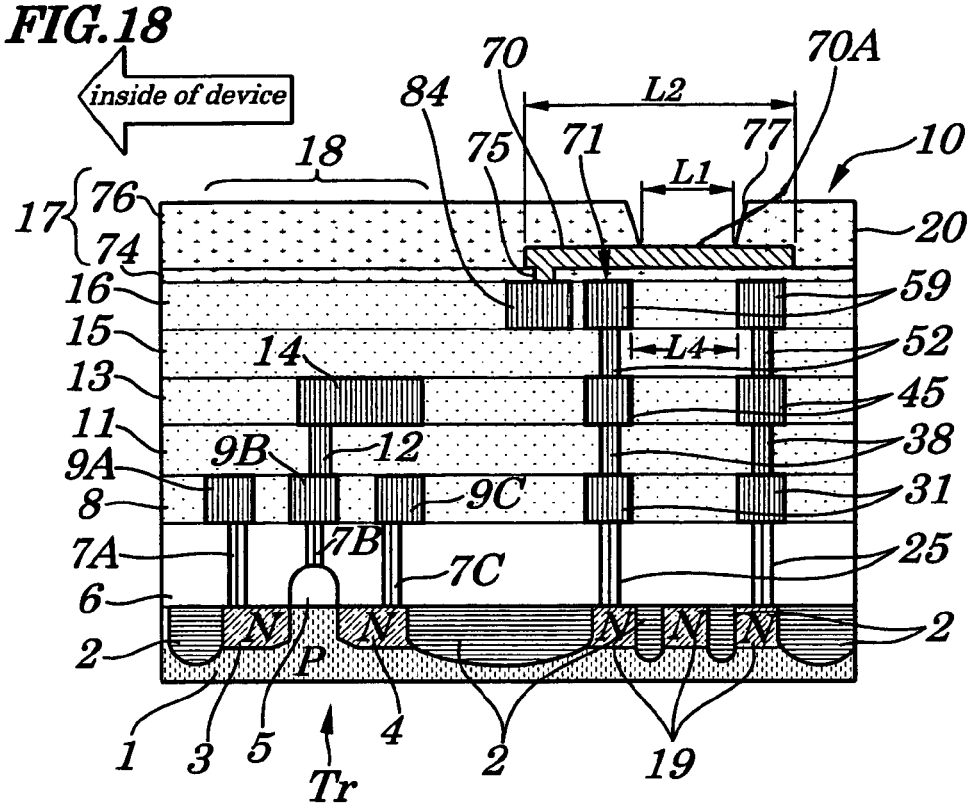
FIG. 18 is a cross-sectional view for showing a configuration of a semiconductor device according to a fifth embodiment of the present invention.

In the semiconductor device according to the present embodiment, as shown in FIG. 18, the assembly pad 70 is connected to an external terminal layer 84 that is a 300 nm-through 2000 nm-thick film made of copper or copper-based metal and that is formed simultaneously with a third wiring layer 59.

Further, as in the case of the fourth embodiment, sizes are set so as to satisfy relationships of L1<L4 and L1<L2 as an indispensable restriction in design so that an opening 77 in a cover insulation film 76 may be within a seal ring 71. From a viewpoint of assembly, on the other hand, a relationship between L1 and L3 can be set arbitrarily.

Except for these, the present embodiment is roughly the same as the fourth embodiment described above. Therefore, components of FIG. 18 that correspond to those of FIGS. 16 and 17 are indicated by the same reference numerals and description thereof is omitted.

According to the semiconductor device of the present embodiment, an exposed face 70A of the assembly pad 70, for example, is arranged as shifted from a position directly above the underlying external terminal layer 84, so that even if a load due to wire bonding is applied, for example, when a wire is bonded onto the exposed face 70A at the time of assembly of an LSI, it is possible to control a load directly applied on a semiconductor chip. It is, therefore, possible to mitigate a degree of occurrence of a pad crack, thus improving an assembly strength. This holds true also with a case where a characteristics evaluation pad or a screening evaluation pad is provided in place of the assembly pad 70.

As described above, by the configuration of the present embodiment too, it is possible to obtain roughly the same effects as those described with the fourth embodiment.

In addition, by the configuration of the present embodiment, it is possible to mitigate the degree of occurrence of the pad crack, thus improving the assembly strength.

Sixth Embodiment

A semiconductor device according to the sixth embodiment of the present invention greatly differs in configuration from that of the fourth embodiment in that a bottomed seal ring is provided as a countermeasure against pad cracks.

Figure 19:
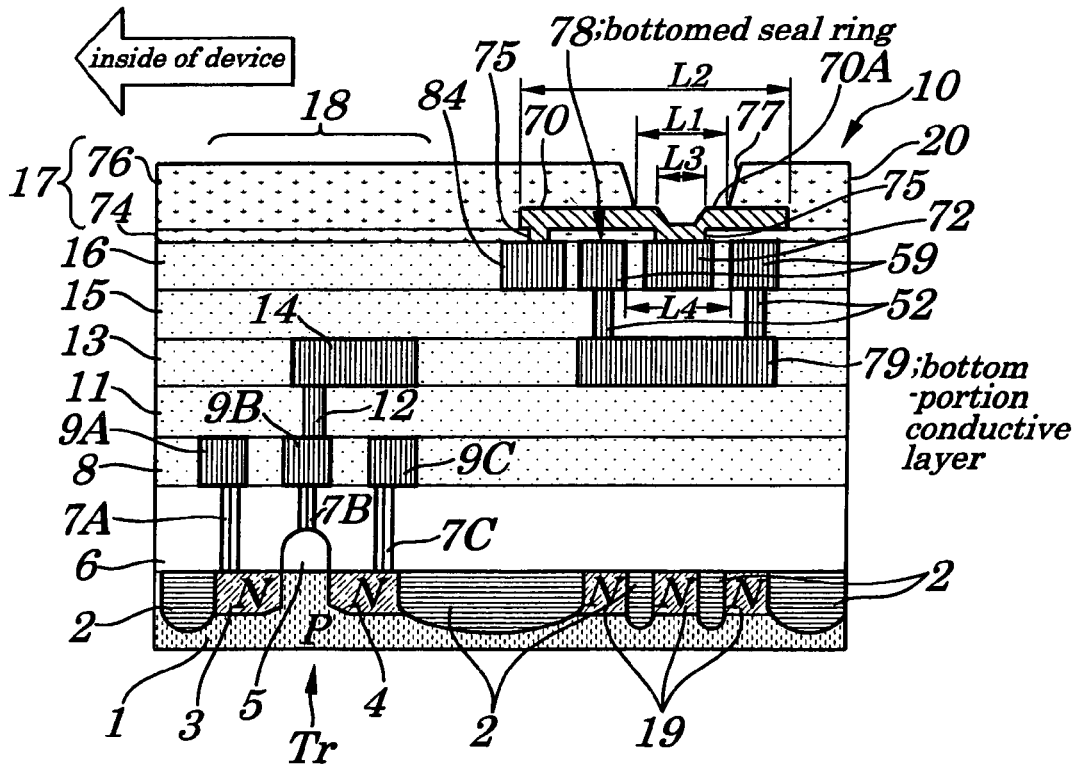
FIG. 19 is a cross-sectional view for showing a configuration of a semiconductor device according to a sixth embodiment of the present invention.

In the semiconductor device of the present embodiment, as shown in FIG. 19, a bottomed seal ring 78 is provided endlessly in such a manner as to surround an assembly pad 70 in a configuration of the fourth embodiment such as shown in FIG. 17 in which the assembly pad 70 is connected with an uppermost wiring layer 72 which is made of a layer of copper or a copper-based metal which is formed simultaneously with a third wiring layer 59 and also with an external terminal layer 84. The bottomed seal ring 78 is formed by connecting a second wiring layer 79 serving as a bottom-portion conductive layer formed directly below the uppermost wiring layer 72, a second via wiring layer 52, and the third wiring layer 59 one after another.

That is, in the semiconductor device of the present embodiment, a seal ring 71 electrically connected to an N-type diffusion region 19 as described with the fourth embodiment shown in FIG. 17 is replaced by the bottomed seal ring 78 formed by connecting the second wiring layer 79 serving as the bottom-portion conductive layer, the second via wiring layer 52, and the third wiring layer 59 one after another as shown in FIG. 19, so that the bottomed seal ring 78 surrounds the assembly pad 70. The bottomed seal ring 78 can be formed specifically by applying the single damascene wiring technology employed to form first through third seal rings 21 to 23 in the first embodiment described with reference to FIGS. 9A to 9D or the dual damascene wiring technology employed to form the same first through third seal rings 21–23 in the second embodiment described with reference to FIGS. 1A and 11B. For example, the second wiring layer 79 serving as the bottom-portion conductive layer that makes up the bottomed seal ring 78 is specifically formed large enough to cover a bottom of the upper-most wiring layer 72 sufficiently when forming a second wiring layer 45 in FIG. 9D.

Further, as in the case of the fourth embodiment, sizes are set so as to satisfy relationships of L1<L4 and L1<L2 as an indispensable restriction in design so that an opening 77 in a cover insulation film 76 may be within the seal ring 71. From a viewpoint of assembly, on the other hand, a relationship between L1 and L3 can be set arbitrarily.

As described above, a semiconductor device in which the bottomed seal ring 78 is provided in such a manner as to surround the assembly pad 70, by forming in the second wiring insulating film 13 the second wiring layer 79 serving as the bottom-portion conductive layer, a region below the second wiring insulating film 13 can be reserved as a clearance region. Therefore, the clearance region can be used as a wiring routing region and a like, thus increasing an utilization ratio of the semiconductor chip, which is especially effective in the case of a high-integration density LSI. Further, by providing the bottomed seal ring 78 having the same potential throughout a semiconductor substrate 1 as in the present embodiment, even if a slit is formed in none of first through third seal rings 21 to 23, an induced current can be prevented from occurring on any of the seal rings even if they are placed in a magnetic field, as described with the third embodiment shown in FIG. 12. This holds true also with a case where the assembly pad 70 is replaced by a characteristics evaluation pad or a screening evaluation pad.

As described above, by the configuration of the present embodiment also, almost the same effects as those described with the fourth embodiment can be obtained.

In addition, by the configuration of the present embodiment, the bottomed seal ring is provided in such a manner as to surround each pad, it is possible to reserve the region below the bottom-portion conductive layer as a clearance region, thus increasing the utilization ratio of the semiconductor chip.

Seventh Embodiment

A semiconductor device according to the seventh embodiment of the present invention greatly differs in configuration from that of the fifth embodiment in that a bottomed seal ring is provided as a countermeasure against pad cracks.

Figure 20:
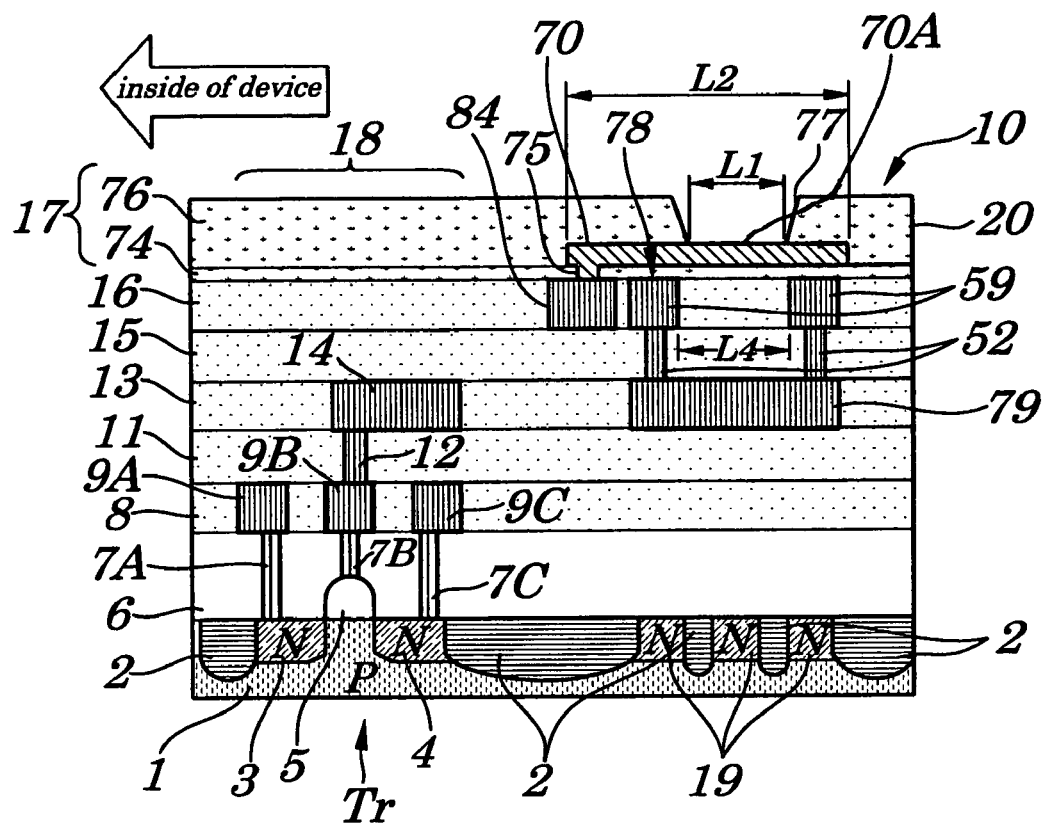
FIG. 20 is a cross-sectional view for showing a configuration of a semiconductor device according to a seventh embodiment of the present invention.

In the semiconductor device of the present embodiment, as shown in FIG. 20, a bottomed seal ring 78 is provided endlessly in such a manner as to surround an assembly pad 70 in a configuration such as described with the fifth embodiment shown in FIG. 17 in which the assembly pad 70 is connected with an external terminal layer 84 which is formed simultaneously with a third wiring layer 59. The bottomed seal ring 78 is formed in roughly the same way as that in the sixth embodiment shown in FIG. 19.

Further, as in the case of the fifth embodiment, sizes are set so as to satisfy relationships of L1<L4 and L1<L2 as an indispensable restriction in design so that an opening 77 in a cover insulation film 76 may be within the seal ring 71. From a viewpoint of assembly, on the other hand, a relationship between L1 and L3 can be set arbitrarily.

Except for these, the present embodiment is roughly the same as the fifth embodiment, so that the components of FIG. 20 that correspond to those of FIG. 18 are indicated by the same reference numerals and description thereof is omitted.

As described above, by the configuration of the present embodiment also, almost the same effects as those described with the fifth embodiment can be obtained.

In addition, by the configuration of the present embodiment, the bottomed seal ring 78 is provided in such a manner as to surround each pad, so that it is possible to reserve a region below a bottom-portion conductive layer as a clearance region, thus increasing a utilization ratio of a semiconductor chip.

Eighth Embodiment

A semiconductor device according to the eighth embodiment of the present invention greatly differs in configuration from that of the fourth embodiment in that a seal ring is provided not as a countermeasure against pad cracks but as a countermeasure against fuse element cracks.

Figure 21:
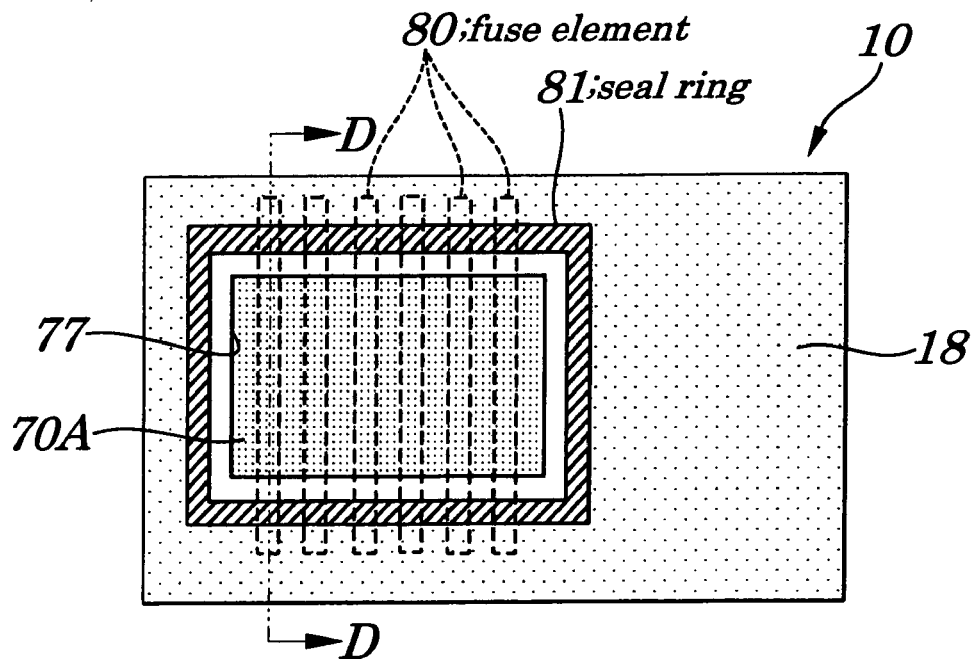
FIG. 21 is a cross-sectional view for showing a configuration of a semiconductor device according to an eighth embodiment of the present invention.
Figure 22:
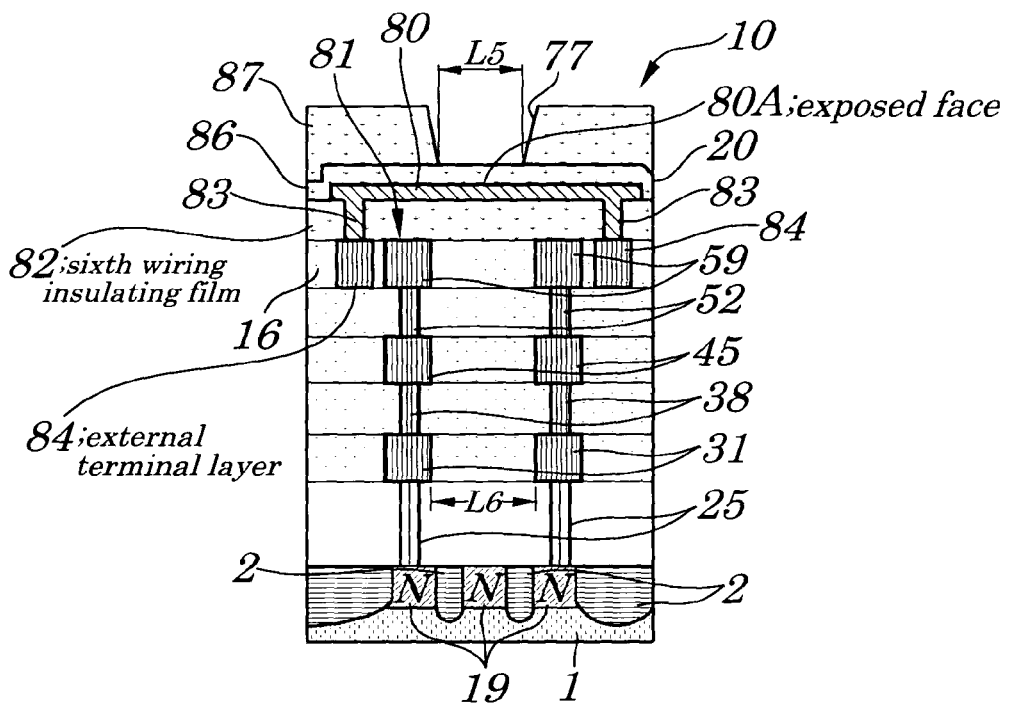
FIG. 22 is a cross-sectional view taken along line D—D of FIG. 21.

According to the semiconductor device of the present embodiment, in a configuration in which a plurality of fuse elements 80 is provided on a surface of a substrate 1 as shown in FIGS. 21 and 22, a seal ring 81 made up of conductive layers extended in a film-thickness direction of first through fifth wiring insulating films 8, 11, 13, 15, and 16 so as to be electrically connected to the respective N-type diffusion regions 19 surrounded by an element isolation region 2 is provided endlessly in such a manner as to surround the plurality of the fuse elements 80. The seal ring 81 is formed by connecting a contact 25 electrically connected with the N-type diffusion region 19, a first wiring layer 31, a first via wiring layer 38, a second wiring layer 45, a second via wiring layer 52, and a third wiring layer 59 one after another. The seal ring 81 can be formed specifically by applying a single damascene wiring technology employed to form first through third seal rings 21 to 23 in the first embodiment described with reference to FIGS. 9A–9D or the dual damascene wiring technology employed to form the same first through third seal rings 21–23 in the second embodiment described with reference to FIG. 10.

The plurality of fuse elements 80 is a 20 nm- to 30 nm-thick film made of titanium nitride or copper-based or aluminum-based metal and formed on a sixth wiring insulating film 82 so as to be electrically connected via a contact 83 formed through the sixth wiring insulating film 82 with an external terminal layer 84 formed through the fifth wiring insulating film 16. The external terminal layer 84 is formed simultaneously in the same process as that in which the third wiring layer 59 is formed. Then, the fuse elements 80 are subjected to a later-described laser trimming on its exposed face 80A, which is indirectly exposed via a first cover insulation film 86 made up of a silicon oxide film, a silicon nitride film, or a like through an opening 77 formed in a second cover insulation film 87 made up of a poly-imide film or a like The plurality of fuse elements 80 is prepared beforehand and, when a semiconductor memory is mounted in a semiconductor device, electrically connected with a desired circuit element formed in a circuit formation portion 18 for replacement of a defective bit. To replace a defective bit, specifically laser trimming is performed on the exposed face 80A of the fuse element 80 that makes up the defective bit, thus cutting off part of a conductive path. When laser trimming is performed on such the fuse element 80, the wiring insulating film is liable to partially encounter a crack, a so-called fuse element crack. As in the case of a pad crack occurring on the assembly pad 70 and a like as described above, water and a like, if having penetrated through a dicing face, penetrates further deeply through the fuse element crack, thus deteriorating moisture resistance. Therefore, it is necessary to take measures against fuse element cracks.

For this purpose, sizes are set so as to satisfy relationships that an inner size L5 of a bottom of the opening in the second cover insulation film 87 may be smaller than an inner size L6 of the seal ring 81 as an indispensable restriction in design so that the opening 77 in the second cover insulation film 87 may be within the seal ring 81.

As described above, according to a semiconductor device in which the seal ring 81 is provided in such a manner as to surround the plurality of the fuse elements 80, even if a fuse element crack occurs due to laser trimming performed via the first cover insulation film 86 on the exposed faces 80A of the plurality of fuse elements 80, water and a like, if having penetrated through the dicing face, can be prevented from penetrating further deeply inward by the presence of the seal ring 81.

In such a manner, in a semiconductor device of the present embodiment, the seal ring 81 made up of conductive layers extended in a film-thickness direction of the first through fifth wiring insulating films 8, 11, 13, 15, and 16 so as to be connected to the N-type diffusion regions 19 surrounded by the element isolation region 2 is provided in such a manner as to surround the plurality of the fuse elements 80, so that even if a fuse element crack occurs, water and a like can be prevented from penetrating deeply inward by the presence of the seal ring 81.

Therefore, in a configuration in which the plurality of the fuse elements 80 is provided, it is possible to improve moisture resistance sufficiently even if a fuse element crack occurs.

Ninth Embodiment

A semiconductor device according to the ninth embodiment of the present invention greatly differs in configuration from that of the eighth embodiment in that a bottomed seal ring is provided as a countermeasure against fuse element cracks.

Figure 23:
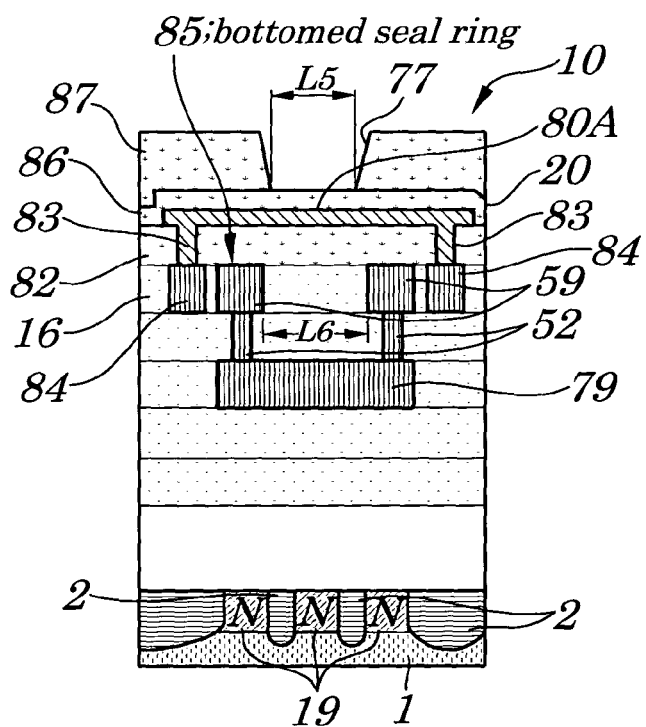
FIG. 23 is a cross-sectional view for showing a configuration of a semiconductor device according to a ninth embodiment of the present invention.

In the semiconductor device of the present embodiment, as shown in FIG. 23 a bottomed seal ring 85 is provided endlessly in such a manner as to surround a plurality of fuse elements 80 in a configuration of the eighth embodiment in which the plurality of fuse elements 80 is provided as shown in FIG. 22. The bottomed seal ring 85 is formed in roughly the same way as in the case of the sixth embodiment shown in FIG. 19.

Further, sizes are set so as to satisfy a relationship of L5<L6 as an indispensable restriction in design so that an opening 77 in a second cover insulation film 87 may be within the bottomed seal ring 85.

As described above, by the configuration of the present embodiment also, almost the same effects as those described with the eighth embodiment can be obtained.

In addition, by the configuration of the present embodiment, the bottomed seal ring 85 is provided in such a manner as to surround the plurality of fuse elements 80, so that it is possible to reserve a region below a bottom-portion conductive layer as a clearance region, thus increasing a utilization ratio of a semiconductor chip.

Tenth Embodiment

A semiconductor device according to the tenth embodiment of the present invention greatly differs in configuration from that of the eighth embodiment in that fuse elements 80 are provided as shifted with respect to a seal ring 81 in arrangement.

Figure 24:
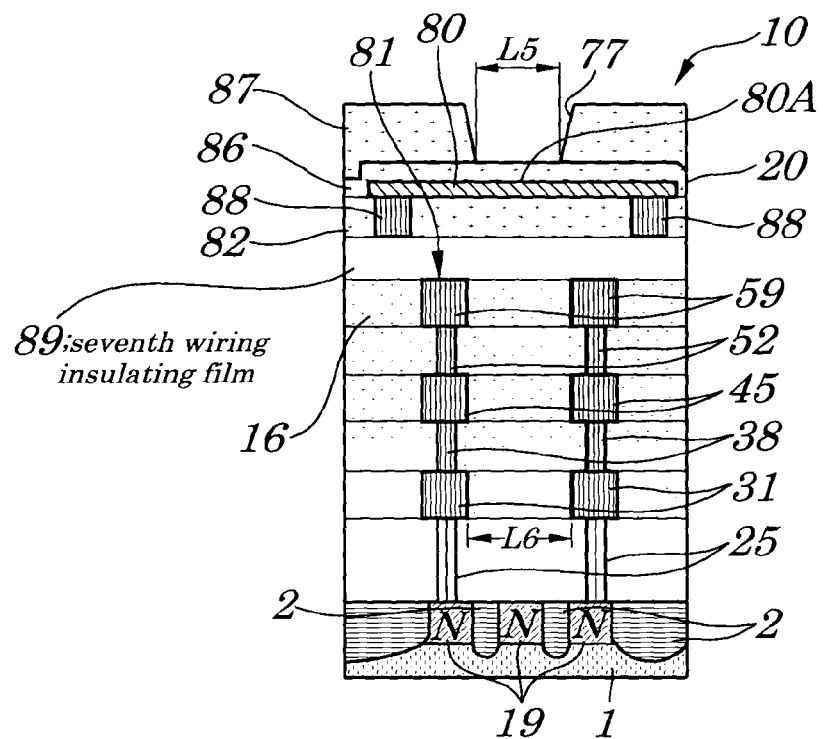
FIG. 24 is a cross-sectional view for showing a configuration of a semiconductor device according to a tenth embodiment of the present invention.

In the semiconductor device of the present invention, as shown in FIG. 24 contact 88 serving as the two electrodes of the fuse elements 80 respectively are formed as separated from a third wiring layer 59 that makes up the seal ring 81 in a configuration such as described with the eighth embodiment shown in FIG. 22 in which a plurality of fuse elements 80 is surrounded by the seal ring 81. That is, the contact 88 is formed through a sixth wiring insulating film 82 that is separated from the third wiring layer 59 via a seventh wiring insulating film 89. This eliminates a necessity of using a via wiring line in order to form the contacts 88 serving as the two electrodes respectively on a fifth wiring insulating film 16, to enable decreasing the number of manufacturing processes, thereby contributing to cost reduction.

Except for these, the present embodiment is roughly the same as the eighth embodiment described above, so that components of FIG. 24 that correspond to those of FIG. 22 are indicated by the same reference numerals and description thereof is omitted.

As described above, by the configuration of the present embodiment too, it is possible to obtain roughly the same effects as those described with the eighth embodiment.

In addition, by the configuration of the present embodiment, the plurality of fuse elements 80 can be formed as separated from the seal ring 81, thus reducing the number of processes.

Eleventh Embodiment

A semiconductor device according to the eleventh embodiment of the present invention greatly differs in configuration from that of the ninth embodiment in that fuse elements are provided as shifted with respect to a seal ring in arrangement.

In the semiconductor device of the present invention, in a configuration such as described with the ninth embodiment shown in FIG. 23 in which a plurality of fuse elements 80 is surrounded by a bottomed seal ring 85, contacts 88 serving as two electrodes of the fuse element 80 respectively are formed as separated from a third wiring layer 59 that makes up the seal ring 85. That is, the contact 88 is formed through a sixth wiring insulating film 82 that is separated from the third wiring layer 59 via a seventh wiring insulating film 89. This eliminates a necessity of using a via wiring line in order to form the contacts 88 serving as the two electrodes respectively on a fifth wiring insulating film 16, to enable decreasing the number of manufacturing processes, thereby contributing to cost reduction.

Figure 25:
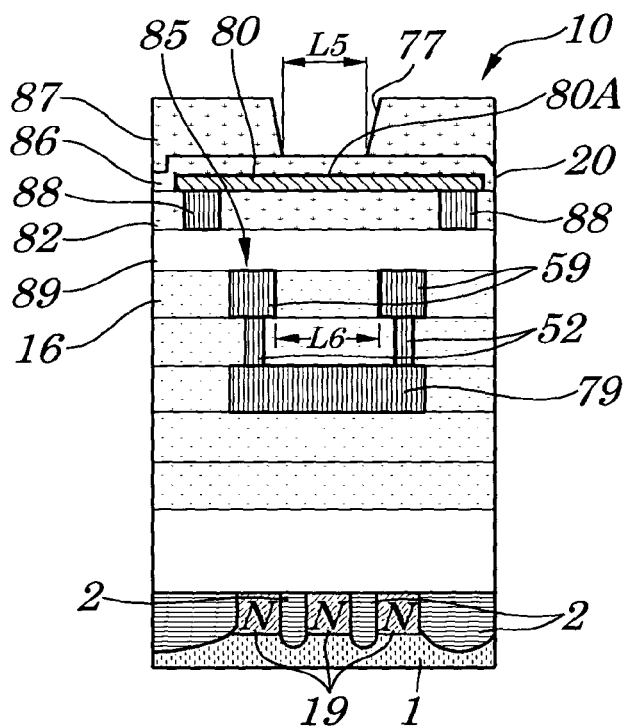
FIG. 25 is a cross-sectional view for showing a configuration of a semiconductor device according to an eleventh embodiment of the present invention.
Figure 26:
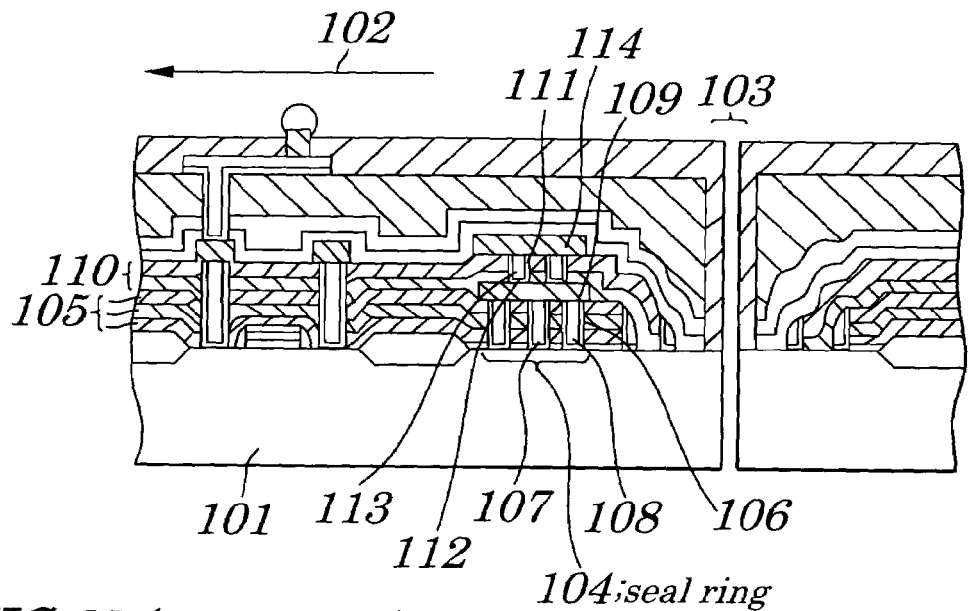
FIG. 26 is a cross-sectional view for showing a configuration of a conventional semiconductor device.
Figure 27:
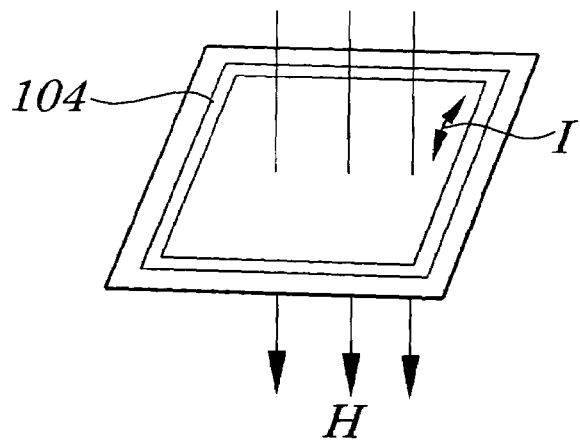
FIG. 27 is an illustration for schematically showing a problem of the conventional semiconductor device.

Except for these, the present embodiment is roughly the same as the ninth embodiment described above, so that components of FIG. 25 that correspond to those of FIG. 23 are indicated by the same reference numerals and description thereof is omitted.

As described above, by the configuration of the present embodiment too, it is possible to obtain roughly the same effects as those described with the ninth embodiment.

In addition, by the configuration of the present embodiment, the plurality of fuse elements can be formed as separated from the seal ring, thus reducing the number of processes.

It is apparent that the present invention is not limited to the above embodiments but may be changed and modified without departing from the scope and spirit of the invention. For example, although the first embodiment has been described in an example where the seal ring is provided as many as three, the number of the seal rings is not limited thereto and only needs to be at least two. Further, although the third embodiment has been described in an example where the seal ring having a slit formed therein is provided as many as three, the number of the seal rings only needs to be at least two. That is, by providing the seal ring having the slit formed therein as many as two and at least by forming the slits at mutually misaligned positions on the two respective seal rings, the slit formed in the outer or inner seal ring is for sure covered by the adjacent inner or outer seal ring respectively to enable making a penetration path long enough to prevent water and a like, if having penetrated through a dicing face, from penetrating further deeply inward, thereby improving moisture resistance sufficiently.

Further, although the first embodiment has been described in an example where the single damascene technology is employed in manufacture and the second embodiment has been described in an example where the dual damascene technology is employed in manufacture, the present invention is not limited thereto and may combine the single damascene and dual damascene technologies in manufacture. In this case, it is preferable in manufacture to form the first wiring layer using the single damascene technology and then form the second and subsequent wiring layers using selected one of the single damascene technology and the dual damascene technology. For example, the second wiring layer may be formed using the single damascene technology to then form the third wiring layer using the dual damascene technology. Alternatively, in the third embodiment also, either the single damascene technology or the dual damascene technology is employed or, as described above, the two technologies may be combined in manufacture. This holds true also with the fourth through eleventh embodiments. Further, in the fourth through eleventh embodiments, two or more of seal rings or two or more of bottomed seal rings may be provided therein.

Further, although the embodiments have been described in an example where copper is used as a material of a conductive layer that makes up a seal ring or a bottomed seal ring, the material is not limited thereto and may be copper-based metal containing copper as its component and a small amount of any other materials such as tin (Sn), silver (Ag), magnesium (Mg), lead (Pb), aluminum (Al), silicon (Si), or titanium (Ti). Further, although the embodiments have been described in an example where five films of the first through fifth wiring insulating films and the corresponding respective conductive layers have been formed so as to provide a seal ring, the present invention can be applied also to the case of forming six wiring insulating films or more. Further, although the embodiments have been described in an example where SiLK is used as a material of a low-dielectric constant film that makes up a main portion of the wiring insulating film, the material is not limited thereto and may be any other such as Methyl-silsesquioxane (MSQ), Hydrogen-silsesquioxane (HSQ), or Ladder-oxide (L-Ox: registered trademark of NEC). Further, the wiring insulating film is not limited in use to a silicon oxide film or silicon nitride film and may be any other such as a Boron-Silicate Glass (BSG) film, a Phospho-Silicate Glass (PSG) film, or Boron-Phospho-Silicate Glass (BPSG) film. Further, although the embodiments have been described in an example where a silicon nitride film is used as the second copper diffusion preventing film, the prevention film is not limited thereto and may be any other SiC—based film such as a silicon carbonate (SiC) film or a silicon carbonitride (SiCN) film. Further, the pattern formation technology is not limited in use to photolithography and may be any other lithographic technology such as Electron-Beam (EB) lithography. Furthermore, the diffusion region for connection of the seal ring may be of any one of N-type and P-type conductivities.

What is claimed is:

1. A semiconductor device comprising:
a semiconductor chip provided with a circuit formation portion comprising a plurality of wiring insulating films stacked on top of each other in layers on a semiconductor substrate, and a multi-layer interconnection formed in said plurality of wiring insulating films,
wherein at least two wiring trenches are formed upwardly or downwardly through said plurality of wiring insulating films along a periphery of said semiconductor chip in such a manner as to surround a specified region on said semiconductor substrate, said at least two wiring trenches including an outer wiring trench surrounding an inner wiring trench,
wherein in each of said wiring trenches, a seal ring is formed by a conductive layer buried via a first conductive layer diffusion preventing film, each seal ring being connected to a diffusion region formed in said semiconductor substrate,
wherein at least one of said wiring insulating films comprises a low dielectric constant film comprising methyl-silsesquioxane or hydrogen-silsesquioxane, and
wherein at least one second conductive layer diffusion preventing film is formed between a lower one and an upper one of said wiring insulating films, each second conductive layer diffusion preventing film being connected with a corresponding one of said first conductive layer diffusion preventing films.

2. The semiconductor device according to claim 1, wherein said specified region comprises a circuit formation portion.

3. The semiconductor device according to claim 1:
wherein one or more slit-like notches are formed at specified positions in said seal rings in such a manner that the respective slit-like notches in any two of said seal rings that are adjacent to each other are not aligned.

4. The semiconductor device according to claim 1, wherein, said at least one seal ring comprises a damascene wiring structure.

5. The semiconductor device according to claim 4, wherein said damascene wiring structure comprises a single damascene wiring structure.

6. The semiconductor device according to claim 4, wherein said damascene wiring structure comprises a dual damascene wiring structure.

7. The semiconductor device according to claim 4, wherein said damascene wiring structure comprises a combination of a single damascene wiring structure and a dual damascene wiring structure.

8. The semiconductor device according to claim 1, wherein:
at least one of said seal rings is connected via a contact to a diffusion region formed in said semiconductor substrate, and
said contact and said diffusion region are formed so as to match approximately said at least one of said seal rings in shape.

9. The semiconductor device according to claim 1, wherein:
at least one of said seal rings is connected via a contact to a diffusion region formed in said semiconductor substrate, and
said contact and said diffusion region are formed without matching said at least one of said seal rings in shape.

10. The semiconductor device according to claim 1, wherein each of said conductive layers comprises copper or a copper-based conductive material.

11. The semiconductor device according to claim 1, wherein said diffusion region comprises an N-type diffusion region.

12. A semiconductor device, comprising:
a semiconductor chip provided with a circuit formation portion comprising a plurality of wiring insulating films stacked on top of each other in layers on a semiconductor substrate, and a multi-layer interconnection formed in said plurality of wiring insulating films,
wherein at least two wiring trenches are formed upwardly or downwardly through said plurality of wiring insulating films along a periphery of said semiconductor chip in such a manner as to surround a specified region on said semiconductor substrate, said at least two wiring trenches including an outer wiring trench surrounding an inner wiring trench, wherein in each wiring trench, a seal ring is formed by a conductive layer buried via a first conductive layer diffusion preventing film, each seal ring being connected to a diffusion region formed in said semiconductor substrate, wherein at least one of said wiring insulating films comprises a low dielectric constant film having a dielectric constant lower than or equal to that of methyl-silsesquioxane, and wherein at least one second conductive layer diffusion preventing film is formed between a lower one and an upper one of said wiring insulating films, each second conductive layer diffusion preventing film being connected with a corresponding one of said first conductive layer diffusion preventing films.

13. A semiconductor device, comprising:

a semiconductor chip provided with a circuit formation portion comprising a plurality of wiring insulating films stacked on top of each other in layers on a semiconductor substrate, and a multi-layer interconnection formed in said plurality of wiring insulating films, wherein at least two wiring trenches are formed upwardly or downwardly through said plurality of wiring insulating films along a periphery of said semiconductor chip in such a manner as to surround a specified region on said semiconductor substrate, said at least two wiring trenches including an outer wiring trench surrounding an inner wiring trench, wherein in each of said wiring trenches, a seal ring is formed by a conductive layer buried via a first conductive layer diffusion preventing film, each seal ring being connected to a diffusion region formed in said semiconductor substrate, wherein at least one of said wiring insulating films comprises a low dielectric constant film having a dielectric constant lower than or equal to that of hydrogen-silsesquioxane, and wherein at least one second conductive layer diffusion preventing film is formed between a lower one and an upper one of said wiring insulating films and is connected with corresponding ones of said first conductive layer diffusion preventing films.

* * * * *